(12) United States Patent
Lee et al.

(10) Patent No.: US 12,543,399 B2
(45) Date of Patent: Feb. 3, 2026

(54) IMAGE SENSORS INCLUDING NANOROD PIXEL ARRAY, METHODS OF MANUFACTURING IMAGE SENSORS, AND ELECTRONIC DEVICES INCLUDING IMAGE SENSORS

(71) Applicant: SAMSUNG ELECTRONICS CO., LTD., Suwon-si (KR)

(72) Inventors: Jeongyub Lee, Yongin-si (KR); Youngchul Leem, Uiwang-si (KR); Eunhyoung Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 324 days.

(21) Appl. No.: 18/111,375

(22) Filed: Feb. 17, 2023

(65) Prior Publication Data

US 2023/0326949 A1    Oct. 12, 2023

(30) Foreign Application Priority Data

Apr. 11, 2022 (KR) .................. 10-2022-0044819

(51) Int. Cl.
  *H10F 39/00* (2025.01)
(52) U.S. Cl.
  CPC ......... *H10F 39/811* (2025.01); *H10F 39/021* (2025.01); *H10F 39/806* (2025.01)
(58) Field of Classification Search
  CPC ..... H10F 39/811; H10F 39/806; H10F 39/021
  See application file for complete search history.

(56) References Cited

U.S. PATENT DOCUMENTS 8,304,759 B2   11/2012 Dutta
2020/0161504 A1*  5/2020 Fimland ............. H10H 20/0133
(Continued)

FOREIGN PATENT DOCUMENTS

KR   10-2020-0023273 A   3/2020
KR   10-2021-0030764 A   3/2021
(Continued)

OTHER PUBLICATIONS

Joseph S. T. Smalley et al., "Subwavelength pixelated CMOS color sensors based on anti-Hermitian metasurface", Nature Communications, vol. 11, Article No. 3916, Aug. 6, 2020, 7 pages, DOI: 10.1038/s41467-020-17743-y.
(Continued)

*Primary Examiner* — Steven M Page
(74) *Attorney, Agent, or Firm* — Sughrue Mion, PLLC

(57) ABSTRACT

Provided is an image sensor including a plurality of first electrode layers spaced apart from each other, a second electrode layer opposite to the plurality of first electrode layers, and a pixel layer provided between the plurality of first electrode layers and the second electrode layer, the pixel layer including a plurality of nanorod pixels, wherein a size of each nanorod pixel among the plurality of nanorod pixels is less than 1 μm, wherein the plurality of nanorod pixels include a first pixel including a compound semiconductor, and wherein the first pixel includes a first compound semiconductor layer doped with a first dopant, a second compound semiconductor layer that is undoped, and a third compound semiconductor layer doped with a second dopant different from the first dopant.

30 Claims, 20 Drawing Sheets

(56) References Cited

U.S. PATENT DOCUMENTS

2021/0072439 A1    3/2021   Cho et al.
2021/0126142 A1*   4/2021   Lee ..................... H10F 77/147
2021/0167110 A1    6/2021   Roh et al.

FOREIGN PATENT DOCUMENTS

KR    10-2021-0048953 A    5/2021
KR    10-2021-0066705 A    6/2021

OTHER PUBLICATIONS

Hyunsung Park et al., "Filter-Free Image Sensor Pixels Comprising Silicon Nanowires with Selective Color Absorption", Nano Letters, vol. 14, No. 4, Mar. 3, 2014, pp. 1804-1809, DOI: 10.1021/nl404379w.
S. Assali et al., "Direct Band Gap Wurtzite Gallium Phosphide Nanowires", Nano Letters, vol. 13, No. 4, Mar. 6, 2013, pp. 1559-1563, DOI: 10.1021/nl304723c.
P. Perlin et al., "Influence of pressure on the optical properties of $In_\chi Ga_{1-\chi}N$ epilayers and quantum structures", Physical Review B, vol. 64, No. 11, Article No. 115319, Aug. 31, 2001, 9 Pages, DOI: 10.1103/PhysRevB.64.115319.
Office Action issued Nov. 20, 2025 by the Korean Intellectual Property Office in KOrean Patent Application No. 10-2022-0044819.

\* cited by examiner

IMAGE SENSORS INCLUDING NANOROD PIXEL ARRAY, METHODS OF MANUFACTURING IMAGE SENSORS, AND ELECTRONIC DEVICES INCLUDING IMAGE SENSORS

CROSS-REFERENCE TO RELATED APPLICATION

This application claims priority to Korean Patent Application No. 10-2022-0044819, filed on Apr. 11, 2022, in the Korean Intellectual Property Office, the disclosure of which is incorporated by reference herein in its entirety.

BACKGROUND

1. Field

Example embodiments of the present disclosure relate to devices including a meta-surface including patterns having a width and/or thickness less than a wavelength of incident light, and more particularly, to image sensors including a nanorod pixel array, methods of manufacturing the image sensors, and electronic devices including the image sensors.

2. Description of Related Art

An image sensor of the related art includes a photodiode, a color filter formed of an organic dye, and a microlens that are sequentially stacked on a readout integrated circuit (ROIC).

In the image sensor of the related art, as the pixel size is decreased to 1 μm or less, the thermal reliability of the color filter and microlenses including organic materials may decrease, and as the pixel size is made smaller, cross talk may occur. Therefore, there is a limit to the development of a high-resolution image sensor having a pixel size of 1 μm or less with a configuration of the image sensor of the related art.

SUMMARY

One or more example embodiments provide image sensors configured to reduce light loss in a visible light band of a nanorod-shaped pixel having a size less than 1 μm.

One or more example embodiments also provide methods of manufacturing such image sensors.

One or more example embodiments also provide electronic devices including image sensors configured to reduce light loss in a visible light band.

Additional aspects will be set forth in part in the description which follows and, in part, will be apparent from the description, or may be learned by practice of example embodiments.

According to an aspect of an example embodiment, there is provided an image sensor including a plurality of first electrode layers spaced apart from each other, a second electrode layer opposite to the plurality of first electrode layers, and a pixel layer provided between the plurality of first electrode layers and the second electrode layer, the pixel layer including a plurality of nanorod pixels, wherein a size of each nanorod pixel among the plurality of nanorod pixels is less than 1 μm, wherein the plurality of nanorod pixels include a first pixel including a compound semiconductor, and wherein the first pixel includes a first compound semiconductor layer doped with a first dopant, a second compound semiconductor layer that is undoped, and a third compound semiconductor layer doped with a second dopant different from the first dopant.

The plurality of nanorod pixels may include a second pixel including a compound semiconductor, a size of the first pixel may be different from a size of the second pixel, and the second pixel may include a first compound semiconductor layer doped with the first dopant, a second compound semiconductor layer that is undoped, and a third compound semiconductor layer doped with the second dopant different from the first dopant.

The plurality of nanorod pixels may include a third pixel including a compound semiconductor, a size of the third pixel may be different from the size of the first pixel and the size of the second pixel, and the third pixel may include a first compound semiconductor layer doped with the first dopant, a second compound semiconductor layer that is undoped, and a third compound semiconductor layer doped with the second dopant different from the first dopant.

The plurality of nanorod pixels may include a fourth pixel including a non-compound semiconductor, and the fourth pixel may include a first non-compound semiconductor layer doped with the first dopant, a second non-compound semiconductor layer that is undoped, and a third non-compound semiconductor layer doped with a second dopant different from the first dopant.

The first compound semiconductor layer, the second compound semiconductor layer, and the third compound semiconductor layer may include a Group III-V compound semiconductor layer, a refractive index n of the Group III-V compound semiconductor layer being greater than 2.4 and an extinction coefficient k of the Group III-V compound semiconductor layer being less than 0.05.

The Group III-V compound semiconductor layer may include one of gallium phosphide (GaP), aluminum gallium phosphide (AlGaP), gallium nitride (GaN), and indium gallium nitride (InGaN).

One of the first dopant and the second dopant may include a p-type dopant, and the other of the first dopant and the second dopant may include an n-type dopant.

The p-type dopant may include one of magnesium (Mg) and zinc (Zn).

The n-type dopant may include one of silicon (Si), germanium (Ge), sulfur (S), selenium (Se), and tellurium (Te).

One of the first dopant and the second dopant may include a p-type dopant, and the other of the first dopant and the second dopant may include an n-type dopant.

The p-type dopant may include one of magnesium (Mg) and zinc (Zn).

The n-type dopant may include one of silicon (Si), germanium (Ge), sulfur (S), selenium (Se), and tellurium (Te).

The first non-compound semiconductor, the second non-compound semiconductor, and the third non-compound semiconductor may include silicon.

A thickness of each nanorod pixel among the plurality of nanorod pixels may be less than or equal to 500 nm.

A diameter of each nanorod pixel among the plurality of nanorod pixels may be in a range of 50 nm to 500 nm.

The plurality of nanorod pixels may be provided with a pitch in a range of 100 nm to 800 nm.

The plurality of nanorod pixels may form an array, the array may include a unit array including a plurality of pixels, and the plurality of pixels included in the unit array may be provided in a quadrangle shape, a square shape, or a hexagonal shape.

Each nanorod pixel among the plurality of nanorod pixels may have a circular column shape or a polygonal column shape.

The image sensor may further include a circuit unit configured to drive and control the pixel layer, and the circuit unit may include a plurality of conductive wirings respectively connected to the plurality of first electrode layers.

A line width of each conductive wiring among the plurality of conductive wirings may be in a range of 20 nm to 150 nm.

Each conductive wiring may include one of ruthenium (Ru), cobalt (Co), molybdenum (Mo), titanium nitride (TiN), tantalum nitride (TaN), copper (Cu), tungsten (W), and aluminum (Al).

According to another aspect of an example embodiment, there is provided a method of manufacturing an image sensor, the method including forming a plurality of vertical nanorod pixels on a first substrate, forming a first electrode layer on each of the plurality of nanorod pixels, forming a conductive wiring on the first electrode layer, forming a second substrate on the conductive wiring, removing the first substrate, and forming a second conductive layer on a surface of a pixel exposed by removing the first substrate, wherein a size of each nanorod pixel among the plurality of nanorod pixels is less than 1 μm, and wherein the plurality of nanorod pixels include a plurality of pixels including compound semiconductors.

The plurality of nanorod pixels may include a plurality of pixels including non-compound semiconductors.

The plurality of pixels including the compound semiconductor may include pixels having different sizes, and each pixel among the plurality of pixels may include a compound semiconductor layer doped with a first dopant, an undoped compound semiconductor layer, and a compound semiconductor layer doped with a second dopant different from the first dopant.

The plurality of pixels of the non-compound semiconductor may include pixels having different sizes, and each pixel among the plurality of pixels may include a non-compound semiconductor layer doped with a first dopant, an undoped non-compound semiconductor layer, and a non-compound semiconductor layer doped with a second dopant different from the first dopant.

The plurality of nanorod pixels may form an array, the array may include a unit array including a plurality of pixels, and the plurality of pixels included in the unit array may be provided in a quadrangle shape, a square shape, or a hexagonal shape.

Each nanorod pixel among the plurality of nanorod pixels may have a circular column shape or a polygonal column shape.

The forming of the plurality of nanorod pixels on the first substrate may include forming an interlayer insulating layer on the first substrate, forming a through hole through which the first substrate is exposed in the interlayer insulating layer, and forming a compound semiconductor layer on the first substrate in the through hole.

The compound semiconductor may be a Group III-V compound semiconductor, a refractive index n of the compound semiconductor being greater than 2.4 (n>2.4) and an extinction coefficient k of the compound semiconductor being less than 0.05 (k<0.05).

According to yet another aspect of an example embodiment, there is provided an electronic device including an image sensor that includes a plurality of first electrode layers spaced apart from each other, a second electrode layer opposite to the plurality of first electrode layers, and a pixel layer provided between the plurality of first electrode layers and the second electrode layer, the pixel layer including a plurality of nanorod pixels, wherein a size of each nanorod pixel among the plurality of nanorod pixels is less than 1 μm, wherein the plurality of nanorod pixels include a first pixel including a compound semiconductor, and wherein the first pixel includes a first compound semiconductor layer doped with a first dopant, a second compound semiconductor layer that is undoped, and a third compound semiconductor layer doped with a second dopant different from the first dopant.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
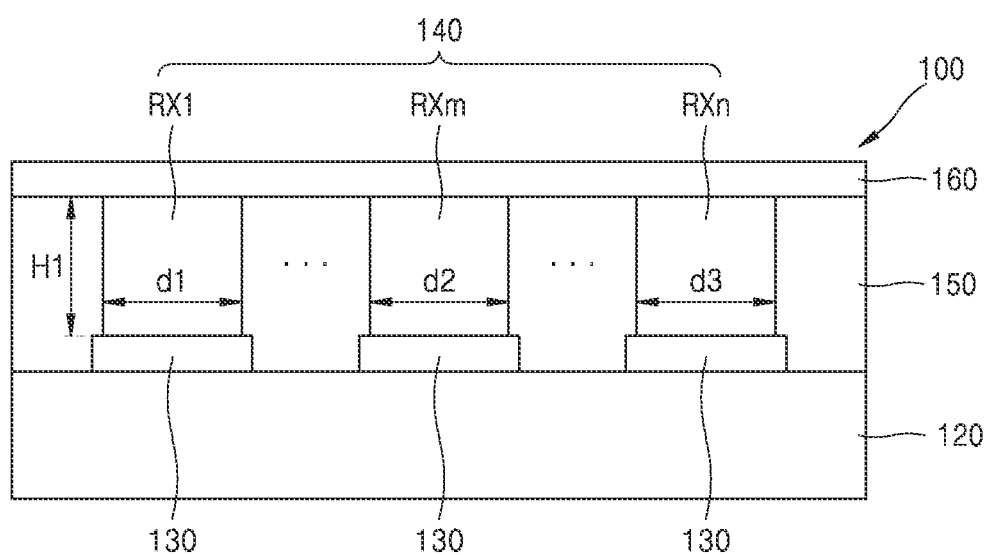
FIG. 1 is a cross-sectional view of an image sensor including a nanorod pixel array according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In order to solve a crosstalk problem occurred in a related image sensor including pixels having a micro size of 1 μm or less, an image sensor to which a vertical PIN-type silicon (Si) nano rod is applied has been introduced.

When such a PIN-type silicon nanorod array is used, a high-resolution image sensor without crosstalk even in a pixel having a size smaller than 1 μm may be implanted.

However, in the case of a silicon nanorod-type pixel, because an extinction coefficient (k) is large in a short wavelength region of a visible light band, when an image device including a pixel array including only silicon nanorods is implemented, a phenomenon of increasing light loss may appear.

In order to solve the problem of light loss in a short wavelength region of a visible light band, a new vertical nanorod material capable of lowering the extinction coefficient (k) may be required. As an example of a new nanorod material, a compound semiconductor nanorod may be considered. In addition, a case in which a compound semiconductor nanorod and a non-compound semiconductor (e.g., Si) nanorod are used together may be considered.

Hereinafter, an image sensor including a nanorod pixel array, a manufacturing method thereof, and an electronic device including the image sensor according to an example embodiment will be described in detail with reference to the accompanying drawings.

In the following description, the thicknesses of the layers or regions shown in the drawings may be exaggerated for clarity of the specification. In addition, the embodiments of the inventive concept may be variously modified and may be embodied in many different forms. In addition, in the layer structure described below, when an element or layer is referred to as being "on" or "above" another element or layer, the element or layer may be directly on another element or layer or intervening elements or layers. In the description below, like reference numerals in each drawing indicate like members.

FIG. 1 shows an image sensor 100 including a nanorod pixel array according to an example embodiment.

Referring to FIG. 1, the image sensor 100 includes a substrate 120 including a circuit unit, a plurality of first electrode layers 130, a pixel layer 140, and a second electrode layer 160. However, embodiments are not limited thereto, and the image sensor 100 may further include one or more other members. The circuit unit may include devices and wires configured to drive and control the pixel layer 140. For example, the wiring may include a wiring that connects the devices and a wiring that connects the devices and the pixel layer 140. For example, the circuit unit may include a readout integrated circuit (ROIC). An upper layer of the substrate 120 may be the circuit unit, and, in the circuit unit, the devices and wiring configured to drive and control the pixel layer 140 are covered or surrounded by an interlayer insulating layer (e.g., SiO layer) for insulation and protection. For example, the substrate 120 may be a silicon (Si) substrate or may include a silicon substrate, but is not limited thereto.

The plurality of first electrode layers 130 are disposed on one surface of the substrate 120. The one surface of the substrate 120 may be the upper surface of the substrate 120, but may be a bottom surface or a side surface depending on a viewpoint. Hereinafter, the one surface of the substrate 120 is considered as the upper surface of the substrate 120.

On the upper surface of the substrate 120, the plurality of first electrode layers 130 are disposed to be separated and spaced apart from each other. In an example, a gap between the adjacent first electrode layers 130 may be the same or different from each other. For example, a diameter or width of the first electrode layer 130 in a direction parallel to the substrate 120 may be the same or different from each other. For example, the diameters of the plurality of first electrode layers 130 may be the same regardless of optical characteristics (e.g., light-receiving characteristics) of the pixels included in the pixel layer 140, but the diameters of the plurality of first electrode layers 130 may be different from each other according to optical characteristics of the pixels constituting the pixel layer 140. The plurality of first electrode layers 130 may be in direct contact with the substrate 120. However, embodiments are not limited thereto. For example, a conductive medium may be provided between the first electrode layers 130 and the substrate 120, and through this, the first electrode layers 130 may indirectly contact the substrate 120. For example, each of the first electrode layers 130 may be a single layer. For example, the first electrode layers 130 may have a multi-layer structure in which single layers are stacked into several layers. The first electrode layers 130 may be electrode layers that are transparent to incident light. For example, the first electrode layer 130 may be or include an indium-tin-oxide (ITO) layer, an indium-zinc-oxide (IZO) layer, or an indium-tin-zinc-oxide (ITZO) layer, but is not limited thereto.

The pixel layer 140 may be provided between the second electrode layer 160 and the plurality of first electrode layers 130. For example, the first electrode layers 130, the pixel layer 140, and the second electrode layer 160 may be sequentially stacked in a direction perpendicular or substantially perpendicular to the upper surface of the substrate 120 in that order. The pixel layer 140 includes a plurality of pixels PX1 ... PXm ... PXn (n>m, m=2, 3, 4 ... ). The plurality of pixels PX1 ... PXm ... PXn are separated and spaced apart from each other. The plurality of pixels PX1 ... PXm ... PXn may include a plurality of first pixels that cause a photoelectric conversion by receiving red light R, a plurality of second pixels that cause a photoelectric conversion by receiving green light G, and a plurality of third pixels that cause a photoelectric conversion by receiving blue light B. The number of the plurality of pixels PX1 ... PXm ... PXn may be the same as the number of the plurality of first electrode layers 130. Accordingly, the plurality of pixels PX1 ... PXm ... PXn may correspond to the plurality of first electrode layers 130 one-to-one. For example, one pixel PX1 ... PXm ... or PXn is provided on one first electrode layer 130. Each of the plurality of pixels PX1 ... PXm ... PXn may be in the form of a nanorod or substantially a nanorod. Accordingly, the pixel layer 140 may be expressed as a nanorod pixel layer 140. The plurality of pixels PX1 ... PXm ... PXn may form an array. For example, when the plurality of pixels PX1 ... PXm ... PXn form an array, the plurality of pixels PX1 ... PXm ... PXn may have a size and arrangement characteristics that satisfy a condition (hereinafter, a first condition) that a coupling coefficient ($x_{pq}$) becomes zero (0) or becomes substantially zero according to the anti-Hermitian coupling theory. For example, in an array including a plurality of pixels PX1 ... PXm ... PXn, an interval, a pitch, an arrangement period, and/or a size of each pixel of the plurality of pixels PX1 ... PXm ... PXn may satisfy the first condition. For example, each of the plurality of pixels PX1 ... PXm ... PXn may have a pattern having a width (diameter) d1, d2, and d3, a thickness (height) H1, an interval, and/or a pitch less than a wavelength of light incident on the pixel layer 140. Accordingly, an array including the plurality of pixels PX1 ... PXm ... PXn may be a meta surface, and the pixel layer 140 may be expressed as a meta surface layer. In an example, each of the plurality of pixels PX1 ... PXm ... PXn may have a thickness H1 of 500 nm or less, a width (diameter) d1, d2, and d3 in a range of about 50 nm to about 500 nm, and a pitch in a range of about 100 nm to about 800 nm. For example, a size of each of the plurality of pixels PX1 ... PXm ... PXn may be in a range of about 0.1 μm to about 0.8 μm, 0.5 μm or less, or 0.3 μm or less.

For example, diameters d1, d2, and d3 of the plurality of pixels PX1 ... PXm ... PXn may be different from each other according to optical characteristics of the plurality of pixels PX1 ... PXm ... PXn. For example, when some of the pixels PX1 are the first pixels (R pixels), some other pixels PXm are the second pixels (G pixels), and the remaining pixels PXn are the third pixels (B pixels), the first diameter d1 of some of the pixels PX1 may be greater than the second diameter d2 of the some other pixels PXm and the third diameter d3 of the remaining pixels PXn, and the second diameter d2 may be greater than the third diameter d3. Because each of the plurality of pixels PX1 ... PXm ... PXn has a dimension less than a wavelength of the incident light, by making the diameters d1, d2, and d3 of the plurality of pixels PX1 ... PXm ... PXn different from each other, some of the plurality 1 of pixels PX1 ... PXm ... PXn may serve as R pixels, some others serve as G pixels, and the rest serve as B pixels.

For example, each of the plurality of pixels PX1 ... PXm ... PXn may serve as a color filter without a separate color filter. In addition, because each of the plurality of pixels PX1 ... PXm ... PXn has a relatively high refractive index, light incident on each of the plurality of pixels PX1 ... PXm ... PXn may be more strongly focused on each of the plurality of pixels PX1 ... PXm ... PXn. As a result, of the plurality of pixels PX1 ... PXm ... PXn may serve as a lens configured to focus light. For example, the refractive index of each of the pixels PX1 ... PXm ... PXn may be 2.0 or more, 2.5 or more, or 3.0 or more, but is not limited thereto.

As will be described later, each of the plurality of pixels PX1 ... PXm ... PXn may have a structure or configuration to serve as a light receiving element (e.g., a photodiode).

As a result, each of the plurality of pixels PX1 ... PXm ... PXn may simultaneously perform functions of a micro lens, a color filter, and a photoelectric conversion element of a conventional back-side illumination CIS. For example, each of the pixels PX1 ... PXm ... PXn may be viewed as a structure in which a micro lens, a color filter, and a photoelectric conversion element are integrally combined.

The second electrode layer 160 is positioned on the pixel layer 140. The second electrode layer 160 may be a common electrode that is commonly connected to the plurality of pixels PX1 ... PXm ... PXn. A voltage for operating each of the plurality of pixels PX1 ... PXm ... PXn may be applied to each of the pixels PX1 ... PXm ... PXn through the first electrode layer 130 and the second electrode layer 160. As an example, the second electrode layer 160 may be an electrode layer transparent to incident light, and the material of the second electrode layer 160 may be ITO, but is not limited thereto.

Spaces between the plurality of pixels PX1 ... PXm ... PXn that are between the substrate 120 and the second electrode layer 160 may be filled with an interlayer insulating layer 150. Spaces between the plurality of first electrode layers 130 that are between the substrate 120 and the second electrode layer 160 may be filled with the interlayer insulating layer 150. For example, each of the pixels PX1 ... PXm ... PXn and each of the first electrode layers 130 may be surrounded by the interlayer insulating layer 150. For example, the interlayer insulating layer 150 may include a silicon oxide layer (e.g., $SiO_2$ layer), but is not limited thereto.

Figure 2:
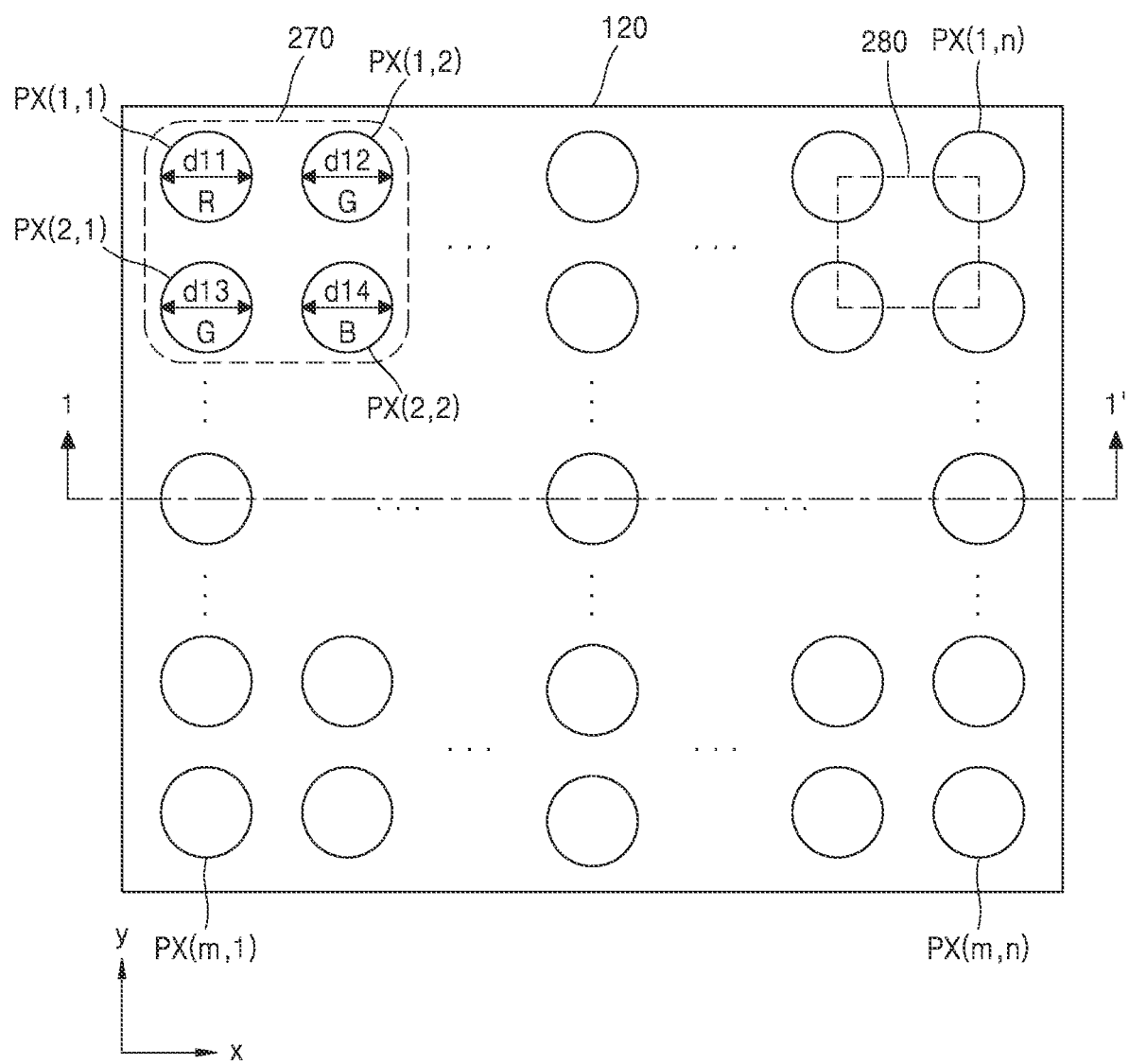
FIG. 2 is a plan view illustrating a nanorod pixel array of an image sensor according to an example embodiment, wherein a planar shape of a unit array is a square (a figure connecting the centers of pixels constituting the unit array is a square)
Figure 3:
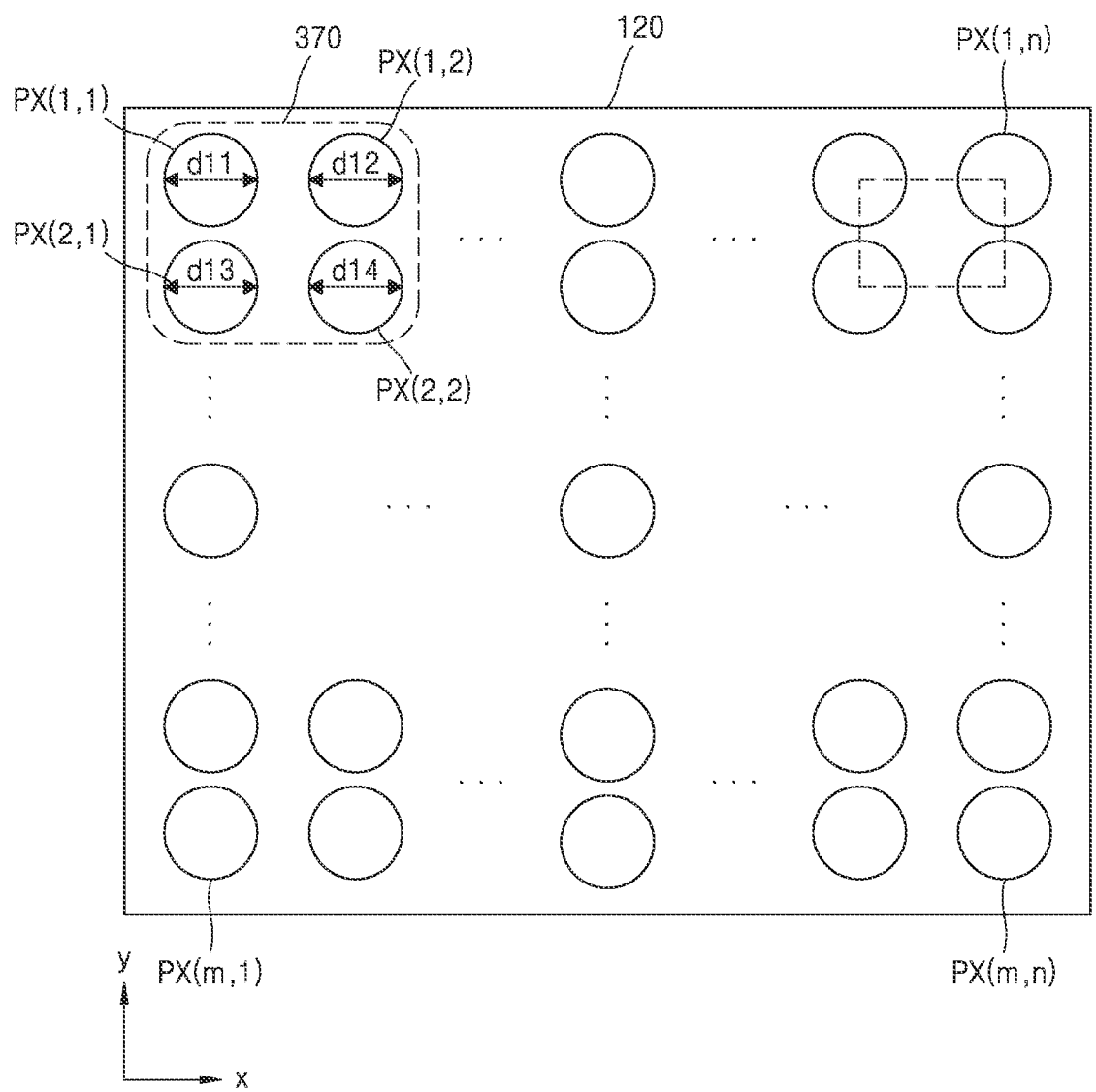
FIG. 3 is a plan view illustrating a nanorod pixel array of an image sensor according to an example embodiment, wherein a planar shape of a unit array is a rectangle.
Figure 4:
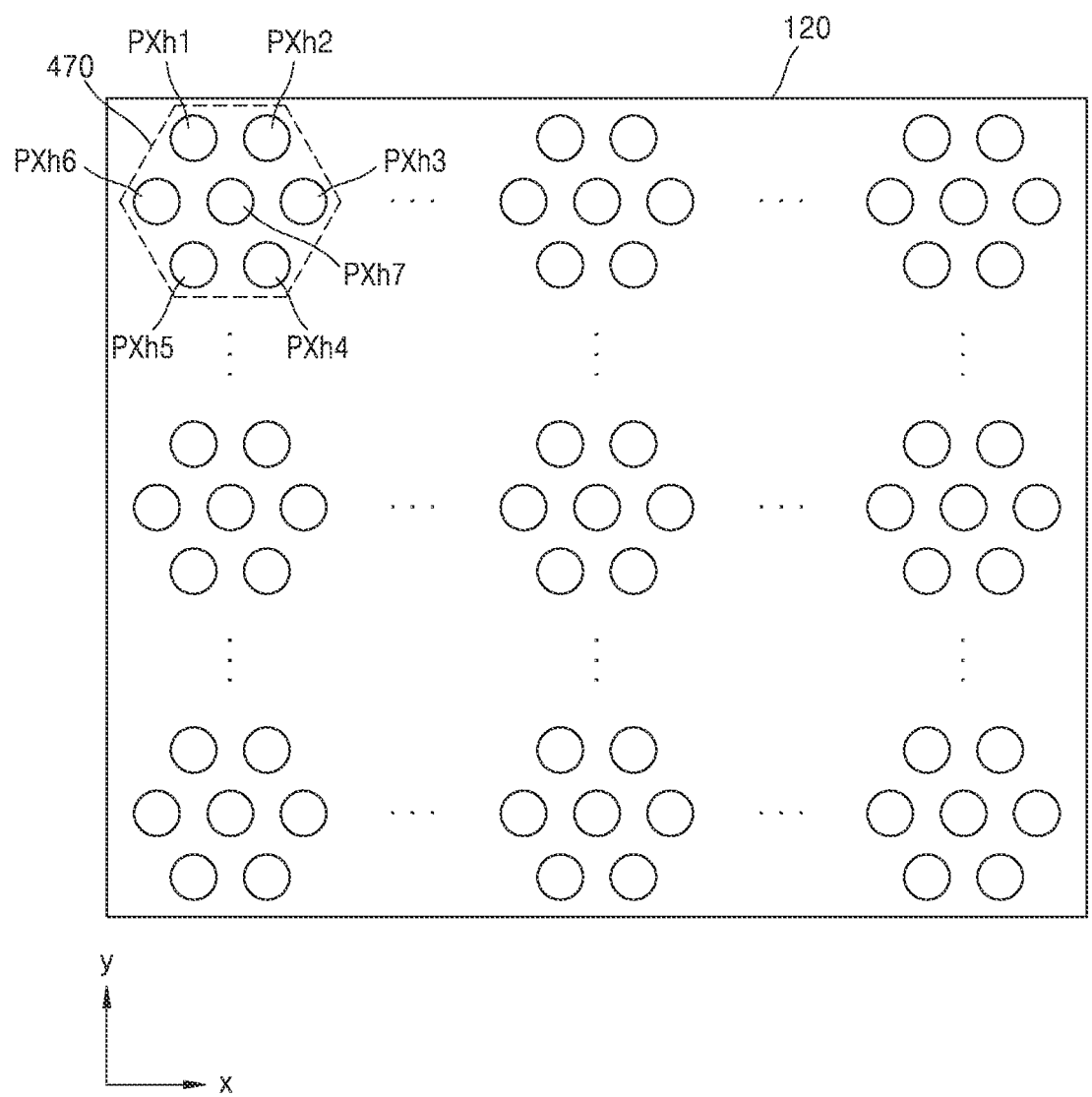
FIG. 4 is a plan view illustrating a nanorod pixel array of an image sensor according to an example embodiment, wherein a planar shape of a unit array is a hexagon.

FIGS. 2 to 4 show a nanorod pixel array including the plurality of pixels PX1 ... PXm ... PXn described in FIG. 1.

FIG. 1 may be a cross-sectional view taken along line 1-1' of FIG. 2.

In FIGS. 2 to 4, only the substrate 120 and pixels PX(1,1) ... PX(m,n) and PXh1-PXh7 are illustrated for convenience. Hereinafter, the same reference numbers as the aforementioned reference numbers indicate the same members, and descriptions thereof will be omitted.

FIG. 2 shows an example in which a planar shape of a unit array 270 of a nanorod pixel array is a square 280. The fact that the planar shape of the unit array 270 is a square 280 indicates that when the centers of all pixels (in the case of FIG. 2, four) of the unit array 270 are connected with a straight line, a shape formed is a square. For example, in FIG. 2, among four pixels (a first pixel PX(1,1), a second pixel PX(1,2), a third pixel PX(2,1), and a fourth pixel PX(2,2)) included in the unit array 270, a distance between the centers of the two pixels PX(2,1) and PX(2,2) arranged in a first direction (x-axis) may be equal to or substantially equal to a distance between the centers of the two pixels PX(1,1) and PX(2,1) arranged in a second direction (y-axis).

The first to fourth pixels PX(1,1), PX(1,2), PX(2,1), and PX(2,2) included in the unit array 270 have first to fourth diameters d11, d12, d13, and d14, respectively. For example, some of the first to fourth diameters d11, d12, d13, and d14 may be different from the other diameters. For example, the first diameter d11 may be different from the second to fourth diameters d12, d13, and d14. For example, the fourth diameter d14 may be different from the first to third diameters d11, d12, and d13. For example, the second and third diameters d12 and d13 may be the same as each other, but may be different from the first and fourth diameters d11 and d14. For example, the first diameter d11 may be greater than the second to fourth diameters d12, d13, and d14, and the first pixel PX(1,1) of the unit array 270 may be an R pixel. In an example, the second diameter d12 may be greater than the first diameter d11 and less than the fourth diameter d14, and the second pixel PX(1,2) may be a G pixel. For example, the fourth diameter d14 may be less than the first to third diameters d11, d12, and d13, and the fourth pixel PX(2,2) may be a B pixel.

The nanorod pixel array PX(1,1) . . . PX(m,n) of FIG. 2 includes the unit array 270 being a predetermined number of times in the x-axis direction and the y-axis direction.

FIG. 3 shows an example in which a planar shape of a unit array 370 of a nanorod pixel array is a rectangle as illustrated in dashed lines. The rectangular shape of the unit array 370 denotes that, when the centers of all pixels (a first pixel PX(1,1), a second pixel PX(1,2), a third pixel PX(2,1), and a fourth pixel PX(2,2)) included in the unit array 370 are connected by a straight line, a rectangle is formed. Accordingly, in FIG. 3, among four pixels (first to fourth pixels PX(1,1), PX(1,2), PX(2,1), and PX(2,2)) included in the unit array 370, a distance between the centers of the two pixels PX(2,1) and PX(2,2) arranged in the first direction (x-axis) may be greater than a distance between the centers of the two pixels PX(1,1) and PX(2,1) arranged in the second direction (y-axis), and vice versa.

The first to fourth pixels PX(1,1), PX(1,2), PX(2,1), and PX(2,2) included in the unit array 370 have first to fourth diameters d11, d12, d13, and d14, respectively. For example, some of the first to fourth diameters d11, d12, d13, and d14 may be different from the other diameters. For example, the first diameter d11 may be different from the second to fourth diameters d12, d13, and d14. For example, the fourth diameter d14 may be different from the first to third diameters d11, d12, and d13. For example, the second and third diameters d12 and d13 may be the same as each other, but may be different from the first and fourth diameters d11 and d14. For example, the first diameter d11 may be greater than the second to fourth diameters d12, d13, and d14, and the first pixel PX(1,1) of the unit array 370 may be an R pixel. In an example, the second diameter d12 may be greater than the first diameter d11 and less than the fourth diameter d14, and the second pixel PX(1,2) may be a G pixel. For example, the fourth diameter d14 may be less than the first to third diameters d11, d12, and d13, and the fourth pixel PX(2,2) may be a B pixel.

The nanorod pixel arrays PX(1,1) . . . (PX(m,n)) of FIG. 3 includes the unit array 370 being repeated a predetermined number of times in the x-axis direction and the y-axis direction.

Figure 5:
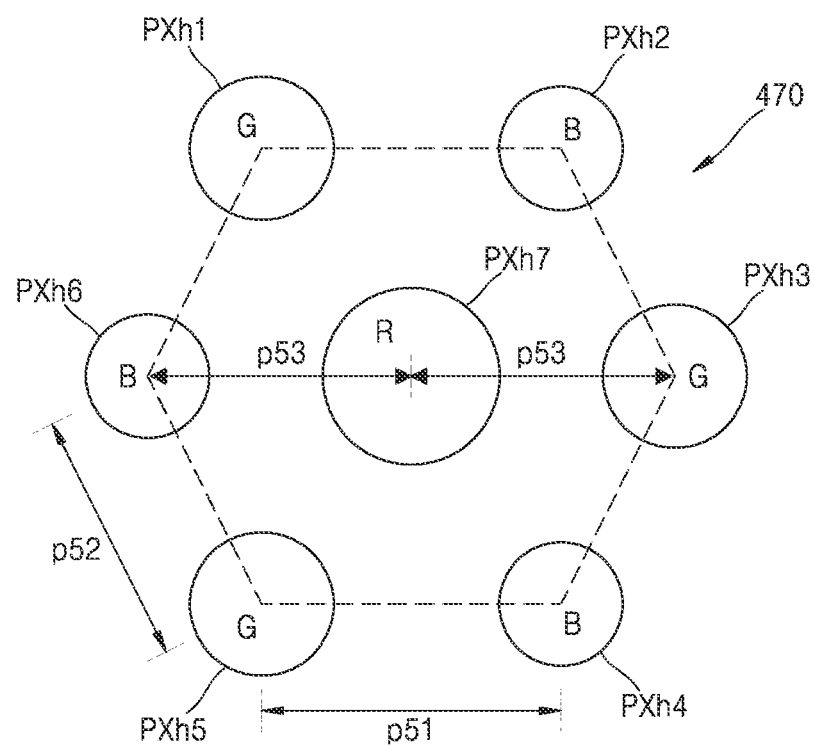
FIG. 5 is an enlarged plan view of the unit array of the nanorod pixel array shown in FIG. 4.

FIG. 4 shows a case in which a planar shape of a unit array 470 of a nanorod pixel array is a hexagon. FIG. 5 shows an example of a case in which the unit array 470 of FIG. 4 is enlarged.

Referring to FIGS. 4 and 5, the fact that the planar shape of the unit array 470 is hexagonal indicates that, as shown in FIG. 5, among the seven pixels PXh1, PXh2, PXh3, PXh4, PXh5, PXh6, and PXh7 included in the unit array 470, when the centers of six pixels PXh1 to PXh6 except for one pixel PXh7 in the center are connected with a straight line, a shape formed is a hexagon.

The nanorod pixel array of FIG. 4 may include the unit array 470 being repeated a predetermined number of times in the x-axis direction and the y-axis direction.

Referring to FIG. 5, in the unit array 470, a seventh pixel PXh7 is positioned at the center, and first to sixth pixels PXh1 to PXh6 are arranged in a hexagonal shape around the seventh pixel PXh7. For example, the hexagon may be a regular hexagon.

In the first to sixth pixels PXh1 to PXh6 forming a hexagon, distances p51 and p52 between the centers of two adjacent pixels may be equal to or substantially equal to each other. In addition, distances p53 between the center of the seventh pixel PXh7 and the centers of the first to sixth pixels PXh1 to PXh6 may be equal to or substantially equal to each other.

In the unit array 470, some of the first to seventh pixels PXh1 to PXh7 may have different diameters from the rest of the first to seventh pixels PXh1 to PXh7. For example, the first, third, and fifth pixels PXh1, PXh3, and PXh5 may have the same diameter, which may be different from the diameters of the remaining pixels PXh2, PXh4, PXh6, and PXh7. For example, the second, fourth, and sixth pixels PXh2, PXh4, and PXh6 may have the same diameter, which may be different from the diameters of the remaining pixels PXh1, PXh3, PXh5, and PXh7. For example, the diameter of the seventh pixel PXh7 may be different from the diameter of the first to sixth pixels PXh1 to PXh6.

For example, the diameter of the seventh pixel PXh7 may be greater than the diameters of the first to sixth pixels PXh1 to PXh6, and the seventh pixel PXh7 may be an R pixel. In an example, the diameters of the first, third, and fifth pixels PXh1, PXh3, and PXh5 may be less than the diameter of the seventh pixel PXh7, may be greater than the diameters of the second, fourth, and sixth pixels PXh2, PXh4, and PXh6, and the first, third, and fifth pixels PXh1, PXh3, and PXh5 may be G pixels. In an example, the diameters of the second, fourth, and sixth pixels PXh2, PXh4, and PXh6 may be less than the diameters of the first, third, fifth, and seventh pixels PXh1, PXh3, PXh5, and PXh7, and the second, fourth, and sixth pixels PXh2, PXh4, and PXh6 may be B pixels.

A planar shape of each pixel included in the nanorod array described with reference to FIG. 2 to 5 or a planar shape of an upper surface of each pixel is a circular shape.

Figure 6:
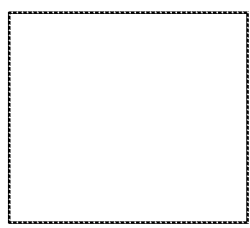
FIG. 6 is a plan view illustrating various planar shapes of nanorod pixels included in an image sensor according to an example embodiment.
Figure 6:
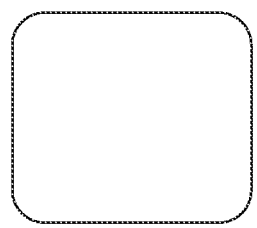
Figure 6:
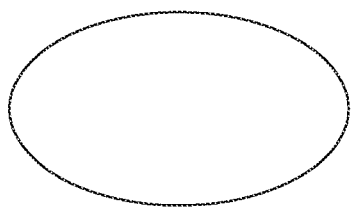
Figure 6:
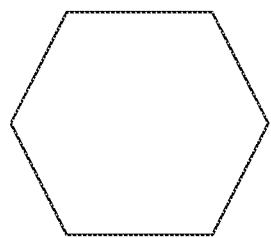
Figure 6:
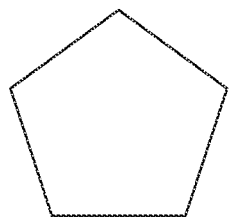
Figure 6:
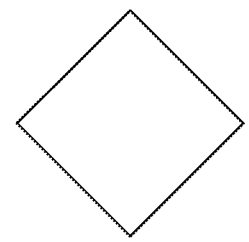

However, each pixel may have various planar shapes other than a circular shape, and FIG. 6 shows an example of various planar shapes.

As shown in FIG. 6, the planar shape of each pixel is a square, a square with rounded corners, an oval, a hexagon, a pentagon, or a diamond shape, but is not limited thereto.

Figure 7:
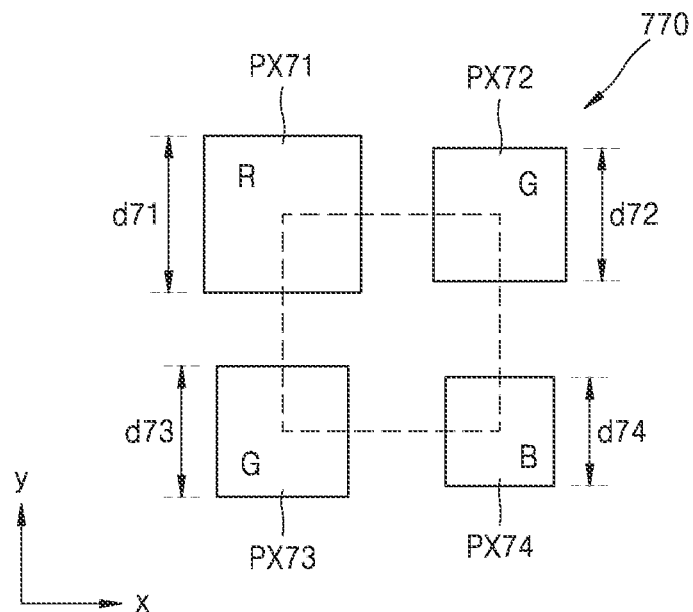
FIG. 7 is a plan view illustrating a quadrangular unit array when a planar shape of each nanorod pixel is a quadrangle in an image sensor including a nanorod pixel array according to an example embodiment.

FIG. 7 illustrates an example in which a unit array of a nanorod pixel array of an image sensor includes non-circular pixels according to an example embodiment.

Referring to FIG. 7, a unit array 770 includes four pixels PX71, PX72, PX73, and PX74, and the first to fourth pixels PX71 to PX74 are arranged so that a line connecting the centers thereof becomes a square (dashed line). For example, the first to fourth pixels PX71 to PX74 included in the unit array 770 are arranged to form a square shape. A planar shape of each of the first to fourth pixels PX71 to PX74 may be non-circular and may be square. In FIG. 7, each square of the solid line representing a planar shape of each of the first to fourth pixels PX71 to PX74 represents a square nanorod column.

The unit array 770 of FIG. 7 may be a modified example of the unit array 270 of FIG. 2. For example, an example of replacing the first to fourth pixels PX(1,1), PX(1,2), PX(2,1), and PX(2,2) of the unit array 270 of FIG. 2 with pixels having a square planar shape may be the unit array 770 of FIG. 7.

In the unit array 770, the first to fourth pixels PX71 to PX74 may have different widths (or diameters) in a given direction (e.g., y-axis). As an example, a width d71 of the first pixel PX71 may be greater than widths d72, d73, and d74 of the second to fourth pixels PX72, PX73, and PX74, and the first pixel PX71 may be an R pixel. The second and third pixels PX72 and PX73 are arranged in a diagonal direction, and the widths d72 and d73 thereof are the same, but are less than the width d71 of the first pixel PX71 and greater than the width d74 of the fourth pixel PX74. Accordingly, the second and third pixels PX72 and PX73 may be G pixels. The width d74 of the fourth pixel PX74 is less than the widths d71, d72, and d73 of the first to third pixels PX71 to PX73. Accordingly, the fourth pixel PX74 may be a B pixel.

Figure 8:
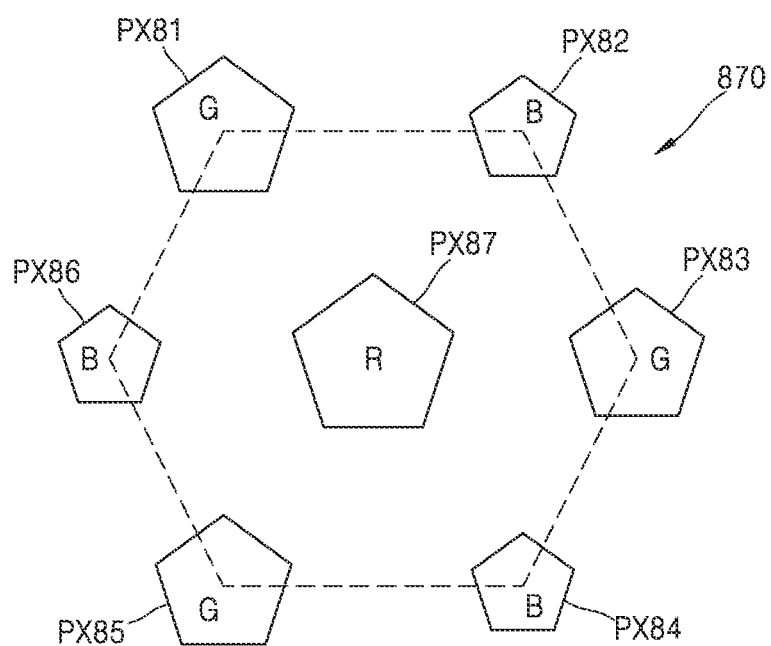
FIG. 8 is a plan view illustrating a hexagonal unit array when a planar shape of each nanorod pixel is a pentagon in an image sensor including a nanorod pixel array according to an example embodiment.

FIG. 8 is an example in which a unit array 870 of a nanorod pixel array of an image sensor according to an example embodiment includes non-circular pixels, and pixels PX81, PX82, PX83, PX84, PX85, PX86, and PX87 included in the unit array 870 are arranged in a hexagonal shape.

Referring to FIG. 8, the unit array 870 includes seven pixels PX81 to PX87. The first to sixth pixels PX81 to PX86 except for the seventh pixel PX87 located at the center are arranged so that a line connecting the centers thereof is a regular hexagon (dashed line). A planar shape of each of the pixels PX81 to PX87 included in the unit array 870 is non-circular and may be a pentagon, which is an example of a polygon. Each of the pentagons in FIG. 8 represents a pentagonal nanorod column.

The unit array 870 of FIG. 8 may be a modified example of the unit array 470 of FIG. 5. For example, the first to seventh pixels PXh1 to PXh7 of the unit array 470 of FIG. 5 may be replaced with pixels having a regular pentagonal planar shape may be the unit array 870 of FIG. 8.

In the unit array 870, a planar area (or an area of an upper surface of each pixel) of the first to seventh pixels PX81 to PX87 may be different from each other. For example, a planar area of the seventh pixel PX87 is greater than that of the first to sixth pixels PX81 to PX86. Accordingly, the seventh pixel PX87 may be an R pixel. For example, planar areas of the first, third, and fifth pixels PX81, PX83, and PX85 may be the same or substantially the same as each other, but may be less than a planar area of the seventh pixel PX87 and greater than that of the second, fourth, and sixth pixels PX82, PX84, and PX86. Accordingly, the first, third, and fifth pixels PX81, PX83, and PX85 may be G pixels. The planar areas of the second, fourth, and sixth pixels PX82, PX84, and PX86 may be less than the planar areas of the first, third, fifth, and seventh pixels PX81, PX83, PX85, and PX87. Accordingly, the second, fourth, and sixth pixels PX82, PX84, and PX86 may be B pixels.

Figure 9:
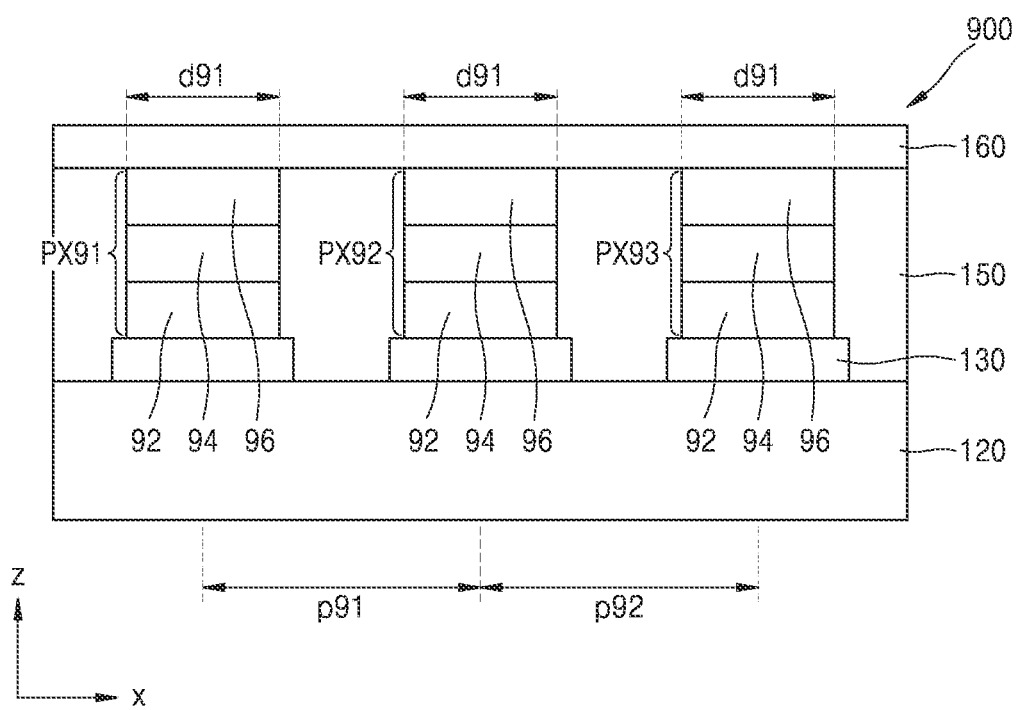
FIG. 9 is a cross-sectional view of a first image sensor illustrating an example embodiment of the image sensor shown in FIG. 1.

FIG. 9 shows a first image sensor 900 as an example embodiment of the image sensor 100 shown in FIG. 1. The first image sensor 900 may correspond to the case when the pixel layer 140 of FIG. 1 includes three pixels (when n of PXn is 3), but the pixel layer 140 may include three or more pixels arranged to form an array. Only parts different from the image sensor 100 of FIG. 1 will be described.

Referring to FIG. 9, in a direction parallel to the substrate 120 (e.g., in the x-axis direction), a first pixel PX91 has a first diameter d91, and a second pixel PX92 has a second diameter d92, and a third pixel PX93 has a third diameter d93. The first to third diameters d91, d92, and d93 may be different from each other. One of the first to third diameters d91, d92, and d93 may be greater than the remaining diameters, and one of the remaining diameters may be the smallest. For example, the first diameter d91 may be greater than the second and third diameters d92 and d93, the second diameter d92 may be less than the first and third diameters d91 and d93, and the third diameter d93 may be the smallest. In this example, the first pixel PX91 may be an R pixel, the second pixel d92 may be a G pixel, and the third pixel d93 may be a B pixel. The first and second pixels PX91 and PX92 are separated from each other by a first pitch p91, and the second and third pixels PX92 and PX93 are separated from each other by a second pitch p92. The first and second pitches p91 and p92 may be the same as or different from each other.

Each of the pixels PX91 to PX93 includes a first semiconductor layer 92, a second semiconductor layer 94, and a third semiconductor layer 96 sequentially stacked on the first electrode layer 130 in a direction toward the second electrode layer 160. The first semiconductor layer 92 may be or include a semiconductor layer doped with a first dopant. The second semiconductor layer 94 may be an undoped intrinsic semiconductor layer or may include such an undoped intrinsic semiconductor layer. The third semiconductor layer 96 may be or include a semiconductor layer doped with a second dopant.

In an example, the semiconductor layer doped with the first dopant may include a compound semiconductor layer doped with the first dopant or a non-compound semiconductor layer doped with the first dopant. In an example, the intrinsic semiconductor layer may include an undoped compound semiconductor layer or an undoped non-compound semiconductor layer. In an example, the semiconductor layer doped with the second dopant may be a compound semiconductor layer doped with the second dopant or a non-compound semiconductor layer doped with the second dopant. In an example, the compound semiconductor layer may include a compound semiconductor including a Group III-V material, but is not limited thereto.

In the example of a material (element) that belongs to Group III and a material (element) that belongs to Group V, the smaller the atomic weight, the larger the band gap (energy gap), and the materials have an extinction coefficient k (which indicates light absorption) that decreases.

Accordingly, the band gap and extinction coefficient k of the Group III-V compound semiconductor may vary depending on the Group III material and the Group V material used. Table 1 shows an example of the Group III-V compound semiconductor and extinction coefficient, refractive index, and band gap of each compound semiconductor. The extinction coefficient k and refractive index n of Table 1 are measured for light having a wavelength of 450 nm.

TABLE 1

| Dielectric (compound semiconductor) | Extinction coefficient k @450 nm | Refractive Index n @450 nm | Bandgap (eV) |
| --- | --- | --- | --- |
| AlN | <1 × 10⁻³ | 2.18 | 6.02 |
| GaN | <1 × 10⁻³ | 2.47 | 3.39 |

TABLE 1-continued

| Dielectric (compound semiconductor) | Extinction coefficient k @450 nm | Refractive Index n @450 nm | Bandgap (eV) |
| --- | --- | --- | --- |
| TiO2 | <1 × 10$^{-3}$ | 2.58 | 3.05 |
| AlGaP | 0.01 | 3.31 | 2.48 |
| AlAs(toxic) | 0.03 | 3.47 | 2.21 |
| GaP | 0.03 | 3.88 | 2.26 |
| InP | 0.67 | 4.00 | 1.35 |
| GaAs | 0.70 | 4.69 | 1.42 |
| AlSb | 1.24 | 5.23 | 1.58 |
| InSb | 2.06 | 3.36 | 0.17 |

For example, in the case of a compound semiconductor including the Group III-V material used in the first to third pixels PX91 to PX93, a refractive index n measured with respect to light having a wavelength of 450 nm may be greater than 2.0 (n>2), greater than 2.4 (n>2.4), greater than 3.0 (n>3.0), an upper limit of the refractive index may be greater than 3.0, and the upper limit of the refractive index n may rise as long as a light loss satisfies a set value.

For example, in the case of a compound semiconductor including the Group III-V material used in the first to third pixels PX91 to PX93, an extinction coefficient k measured with respect to light having a wavelength of 450 nm may be less than 0.05 (k<0.05), less than 0.03 (k<0.03), less than 0.02 (k<0.02), or less than 0.01 (k<0.01).

For example, in the case of a compound semiconductor including the Group III-V material used in the first to third pixels PX91 to PX93, a bandgap measured with respect to light having a wavelength of 450 nm may be greater than 2.0 eV, greater than 2.2 eV, greater than 2.4 eV, greater than 3.0 eV, or greater than 3.3 eV.

In the case of a compound semiconductor including the Group III-V material used for the first to third pixels PX91 to PX93, because at least one of these conditions is satisfied, it is possible to reduce light loss in a long wavelength band (R region) of a visible light band (e.g., 450 nm to 650 nm) as well as in a short wavelength band (G region and B region).

For example, the compound semiconductor including the Group III-V material used in the first to third pixels PX91 to PX93 may include any one of gallium phosphide (GaP), aluminum gallium phosphide (AlGaP), gallium nitride (GaN), and indium gallium nitride (InGaN), but the material is not limited to these materials. For example, the non-compound semiconductor layer may be a silicon layer, but is not limited thereto.

In an example, the first dopant may include a p-type or n-type dopant. Accordingly, the semiconductor layer including the first dopant may be a p-type or n-type semiconductor layer. In an example, the second dopant may include a p-type or n-type dopant. Accordingly, the semiconductor layer including the second dopant may be a p-type or n-type semiconductor layer. When the semiconductor layer is the Group III-V compound semiconductor layer, the semiconductor layer doped with the first dopant is a p-type or n-type compound semiconductor layer, and the semiconductor layer doped with the second dopant is a p-type or n-type compound semiconductor layer. Accordingly, For example, each of the pixels PX91 to PX93 includes a p-type compound semiconductor layer, an undoped compound semiconductor layer, and an n-type compound semiconductor layer sequentially stacked on the first electrode layer 130 in a direction of the second electrode layer 160. For example, each of the pixels PX91 to PX93 may include an n-type compound semiconductor layer, an undoped compound semiconductor layer, and a p-type compound semiconductor layer sequentially stacked on the first electrode layer 130 in the direction toward the second electrode layer 160.

A layer structure including a p-type semiconductor layer, an undoped semiconductor layer, and an n-type semiconductor layer sequentially stacked on the first electrode layer 130 in the direction toward the second electrode layer 160 is referred to as a PIN structure. In addition, a layer structure including an n-type semiconductor layer, an undoped semiconductor layer, and a p-type semiconductor layer sequentially stacked on the first electrode layer 130 in the direction of the second electrode layer 160 is referred to as a NIP structure. The expressions "PIN structure" or "NIP structure" are expressions that may be used in both cases when the first to third semiconductor layers 92, 94, and 96 are compound semiconductors and non-compound semiconductors, but when the first to third semiconductor layers 92, 94, and 96 of each of the pixels PX91 to PX93 are compound semiconductor layers, the expressions "PIN structure" or "NIP structure" are may be expressed as "compound semiconductor PIN structure" or "compound semiconductor NIP structure". A pixel having a PIN structure or a NIP structure may be positioned between the first and second electrode layers 130 and 160 to function as a photoelectric conversion element.

For example, the p-type dopant may include one of magnesium (Mg) and zinc (Zn), but is not limited thereto. For example, the n-type dopant may include one of silicon (Si), germanium (Ge), sulfur (S,) selenium (Se), and tellurium (Te), but is not limited thereto.

As described above, the first to third semiconductor layers 92, 94, and 96 of each of the pixels PX91, PX92, and PX93 of the first image sensor 900 may be variously combined. For example, the first to third semiconductor layers 92, 94, and 96 may have a PIN structure or a compound semiconductor PIN structure in which a Mg-doped GaP layer, an undoped GaP layer, and a Si-doped GaP layer are sequentially stacked, or a Mg-doped AlGaP layer, an undoped AlGaP layer, and a Te-doped AlGaP layer are sequentially stacked.

For example, as one of the combinations, the first to third semiconductor layers 92, 94, 96 have a NIP structure or a compound semiconductor NIP structure in which a Si doped AlGaP layer, an undoped AlGaP layer, and a Mg doped AlGaP layer are sequentially stacked, or a Te doped GaP layer, an undoped GaP layer, and a Zn doped GaP layer are sequentially stacked.

Figure 10:
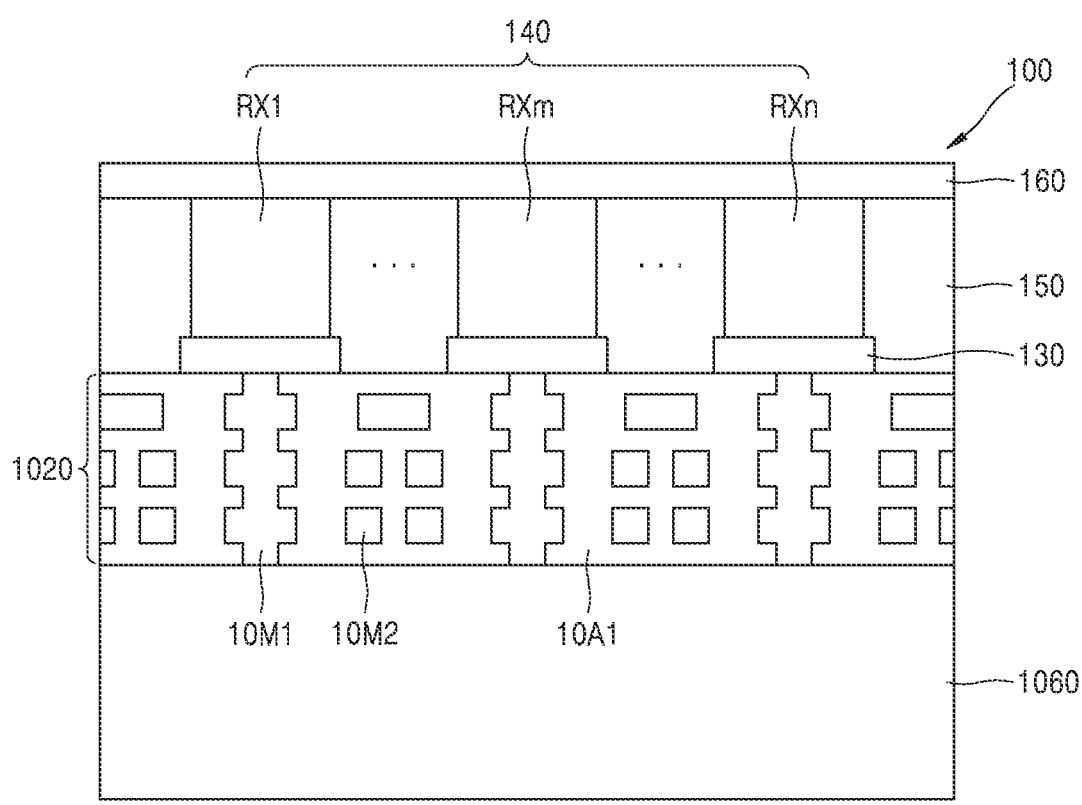
FIG. 10 is a cross-sectional view illustrating a connection between a metal interconnection wire of a readout integrated circuit (ROIC) and a pixel in an image sensor including a nanorod pixel array according to an example embodiment.

FIG. 10 shows a connection between a circuit unit 1020 and the pixel layer 140 in the image sensor 100 according to an example embodiment.

Referring to FIG. 10, the circuit unit 1020 is provided on a substrate 1060, and the pixel layer 140 is provided on the circuit unit 1020. The substrate 1060, the circuit unit 1020, and the pixel layer 140 are sequentially stacked. The pixel layer 140 is a collective expression for the plurality of pixels PX1 . . . PXm . . . PXn, but in an example, an entire portion formed on the circuit unit 1020, that is, the first and second electrode layers 130 and 160, the interlayer insulation layer 150, and the plurality of pixels PX1 . . . PXm . . . PXn may be collectively expressed as a pixel layer.

For example, the substrate 1060 may include a printed circuit board (PCB). The circuit unit 1020 includes a plurality of conductive wirings 10M1 and 10M2. The plurality of conductive wirings 10M1 and 10M2 include first conductive wirings 10M1 provided in a direction perpendicular or substantially perpendicular to the substrate 1060 and second conductive wirings 10M2 provided in a direction parallel or substantially parallel to the substrate 1060. The plurality of first conductive wirings 10M1 are connected to the pixel layer 140. The first electrode layer 130 is disposed between the first conductive wirings 10M1 and the pixel layer 140. Accordingly, each of the first conductive wirings 10M1 may be indirectly connected to each of the pixels PX1 ... PXm ... PXn included in the pixel layer 140 through the first electrode layer 130. For example, a material (substance) of the plurality of conductive wirings 10M1 and 10M2 may include a wiring including a metal material having a relatively low resistance. For example, the metal material having a relatively low resistance may include any one of ruthenium (Ru), cobalt (Co), molybdenum (Mo), titanium nitride (TiN), tantalum nitride (TaN), copper (Cu), tungsten (W), and aluminum (Al), but is not limited thereto. For example, each of the conductive wirings 10M1 and 10M2 may be a single-layered wiring or may include a wiring having a layered structure in which a plurality of single-layers are stacked. For example, each of the conductive wirings 10M1 and 10M2 may have a first line width. For example, the first line width may be less than 1 µm, for example, 300 nm or less, 200 nm or less, 150 nm or less, in a range of about 10 nm to about 170 nm, or in a range of about 20 nm to about 150 nm.

An interlayer insulating layer 10A1 may be formed between the plurality of conductive wirings 10M1 and 10M2 in the circuit unit 1020. For example, a space between the plurality of conductive wirings 10M1 and 10M2 may be filled with the interlayer insulating layer 10A1, and surfaces exposed to the outside of each of the conductive wirings 10M1 and 10M2 may be covered with or surrounded by the interlayer insulating layer 10A1. For example, the interlayer insulating layer 10A1 may include a silicon oxide layer (e.g., a silicon oxide ($SiO_2$) layer), but is not limited thereto.

Figure 11:
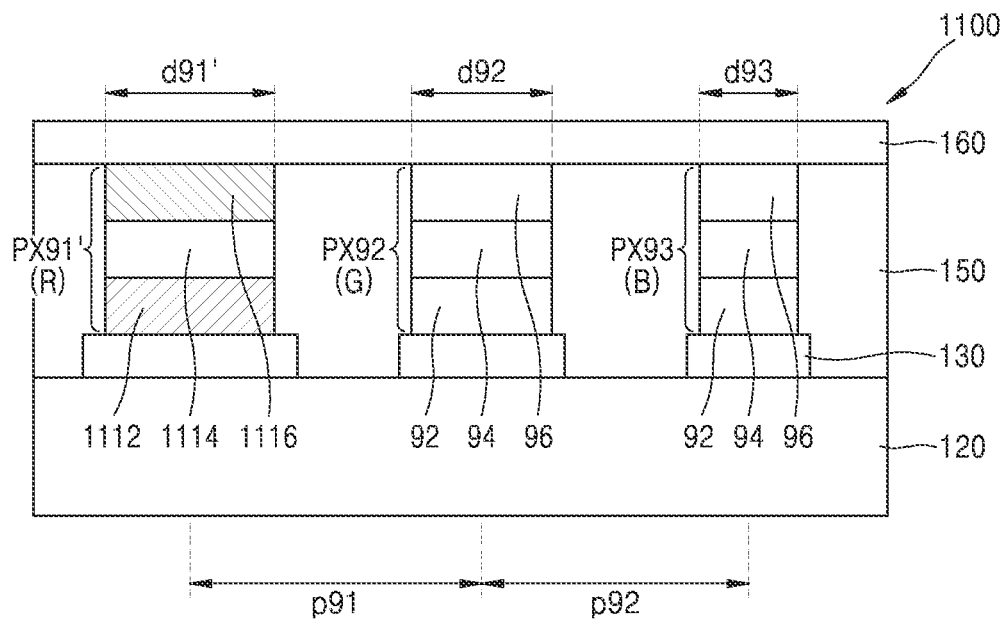
FIG. 11 is a cross-sectional view of a second image sensor illustrating an example embodiment of the image sensor shown in FIG. 1.

FIG. 11 shows a second image sensor 1100 including a nanorod pixel array according to an example embodiment.

Referring to FIG. 11, the second image sensor 1100 may include a non-compound semiconductor pixel instead of the first pixel PX91 in the first image sensor 900 of FIG. 9.

For example, a diameter d91' of a first pixel PX91' of the second image sensor 1100 may be the same as a diameter d91 of the first pixel PX91 of the first image sensor 900 of FIG. 9, but embodiments are not limited thereto, and the diameter d91' may be different from the diameter d91.

The first pixel PX91' may include a first semiconductor layer 1112, a second semiconductor layer 1114, and a third semiconductor layer 1116 sequentially stacked on the first electrode layer 130 in the direction of the second electrode layer 160.

In an example, the first to third semiconductor layers 1112, 1114, and 1116 may be a non-compound semiconductor layer or include a non-compound semiconductor layer. As an example, the first to third semiconductor layers 1112, 1114, and 1116 may include semiconductors having a characteristic in which light loss in a long wavelength band of visible light is equal to or less than a predetermined value. For example, the first to third semiconductor layers 1112, 1114, and 1116 may be non-compound semiconductor layers having a relatively high first refractive index in a relatively long wavelength band of visible light and an extinction coefficient k less than or equal to a set value, or include such a non-compound semiconductor layer. For example, the first refractive index may be greater than 3. For example, the set value of the extinction coefficient k may be 0.05. In an example, the long wavelength band may include a band of 550 nm or more, 570 nm or more, in a range of about 550 nm to about 700 nm, or in a range of about 550 nm to about 650 nm. For example, the first to third semiconductor layers 1112, 1114, and 1116 satisfying these conditions may include a Si layer, but is not limited thereto.

For example, the first semiconductor layer 1112 may include a Si layer doped with the first dopant. For example, the second semiconductor layer 1114 may include an intrinsic Si layer (undoped Si layer). For example, the third semiconductor layer 1116 may include a Si layer doped with the second dopant. According to the type of the first and second dopants, the first to third semiconductor layers 1112, 1114, and 1116 may be sub-micropixels having a PIN structure or a NIP structure.

As a result, the first pixel PX91' may be a vertical nanorod-shaped pixel having a size of sub-micro (e.g., less than 0.5 µm) that may correspond to a long wavelength band of visible light, that is, a vertical nanorod-shaped R pixel.

For example, the second pixel PX92 of the second image sensor 1100 is a pixel in the form of a vertical nanorod, and the diameter d92 is less than the diameter d91' of the first pixel PX91' and greater than the diameter of the third pixel PX93. The third pixel PX93 is a pixel in the form of a vertical nanorod, and the diameter d93 is less than the diameters d91' and d92 of the first and second pixels PX91' and PX92. Accordingly, the second pixel PX92 may be a G pixel, and the third pixel PX93 may be a B pixel. The second and third pixels PX92 and PX93 may be compound semiconductor pixels in which all the first to third semiconductor layers 92, 94, and 96 include a compound semiconductor layer.

As such, the second image sensor 1100 includes a non-compound semiconductor pixel in which all of the semiconductor layers included in a PIN structure or NIP structure include non-compound semiconductor layers and a compound semiconductor pixel in which all of the semiconductor layers included in the PIN structure or NIP structure include compound semiconductor layers. Accordingly, the second image sensor 1100 may be expressed as a mixed image sensor or a mixed-type image sensor.

Figure 12:
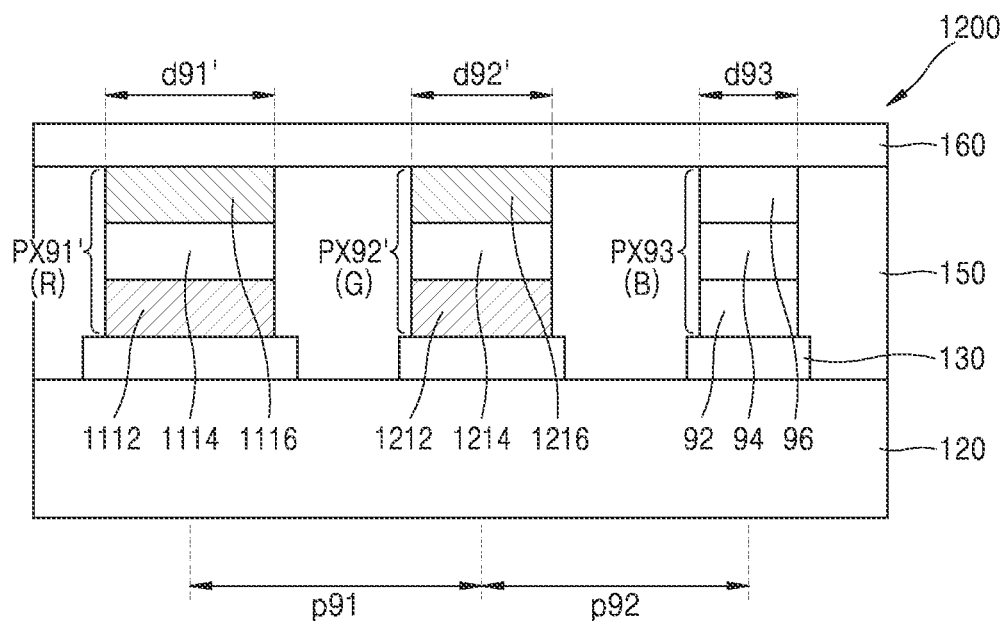
FIG. 12 is a cross-sectional view of a third image sensor illustrating an example embodiment of the image sensor shown in FIG. 1.

FIG. 12 shows a third image sensor 1200 including a nanorod pixel array according to an example embodiment. Only parts different from the second image sensor 1100 of FIG. 11 will be described.

Referring to FIG. 12, the third image sensor 1200 may include non-compound semiconductor pixels instead of the first and second pixels PX91 and PX92 in the first image sensor 900 of FIG. 9.

For example, a diameter d92' of the second pixel PX92' of the third image sensor 1200 may be the same as the diameter d92 of the second pixel PX92 of the first image sensor 900 of FIG. 9, but embodiments are not limited thereto, and the diameter d92' may be different from the diameter d92.

The second pixel PX92' of FIG. 12 may include a first semiconductor layer 1212, a second semiconductor layer 1214, and a third semiconductor layer 1216 sequentially stacked on the first electrode layer 130 in the direction of the second electrode layer 160. For example, the first to third semiconductor layers 1212, 1214, and 1216 may be non-compound semiconductor layers or include non-compound semiconductor layers. For example, the material (substance) of the first to third semiconductor layers 1212, 1214, and 1216 may be the same as that of the first pixel PX91', but may be different from each other.

For example, the first to third semiconductor layers 1212, 1214, and 1216 may include semiconductors having a characteristic in which light loss in a given wavelength band of visible light is equal to or less than a set value. For example, the first to third semiconductor layers 1212, 1214, and 1216 may be non-compound semiconductor layers having an extinction coefficient k equal to or less than a set value while having a second refractive index in a given wavelength band of visible light, or may include such non-compound semiconductor layers. For example, the second refractive index may be greater than 3. For example, the set value of the extinction coefficient k may be 0.05. In an example, the given wavelength band may include a band of 550 nm or more, 570 nm or more, in a range of about 550 nm to about 700 nm, or in a range of about 550 nm to about 650 nm. Satisfying these conditions, for example, the first to third semiconductor layers 1212, 1214, and 1216 may include a Si layer, but is not limited thereto.

For example, the first semiconductor layer 1212 may include a Si layer doped with the first dopant. For example, the second semiconductor layer 1214 may include an intrinsic Si layer (undoped Si layer). For example, the third semiconductor layer 1216 may include a Si layer doped with the second dopant. The second pixel PX92' including the first to third semiconductor layers 1212, 1214, and 1216 may be a sub-micro-pixel having a PIN structure or a NIP structure according to the type of the first and second dopants.

The diameter d92' of the second pixel PX92' is less than the diameter d91' of the first pixel PX91' and greater than the diameter d93 of the third pixel PX93. Accordingly, a wavelength band to which the second pixel PX92' may correspond in the visible light band may be located between a wavelength band corresponding to the first pixel PX91' and a wavelength band corresponding to the third pixel PX93. Because the first pixel PX91' is an R pixel corresponding to a red light region R of visible light and the third pixel PX93 is a B pixel corresponding to a blue light region B of visible light, the second pixel PX92' may be a G pixel corresponding to a green light region G of visible light.

Similar to the first and third pixels PX91' and PX93, the second pixel PX92' may be a pixel in the form of a vertical nanorod having a size of a sub-micrometer (e.g., less than 0.5 μm).

In the third image sensor 1200, the third pixel PX93 may be a compound semiconductor pixel. Accordingly, similar to the second image sensor 1100, the third image sensor 1200 may also be expressed as a mixed image sensor or a mixed-type image sensor including both non-compound semiconductor pixels and compound semiconductor pixels.

Next, a method of manufacturing an image sensor including a nanorod pixel array (meta surface) according to an example embodiment will be described in detail with reference to FIGS. 13 to 22.

Figure 13:
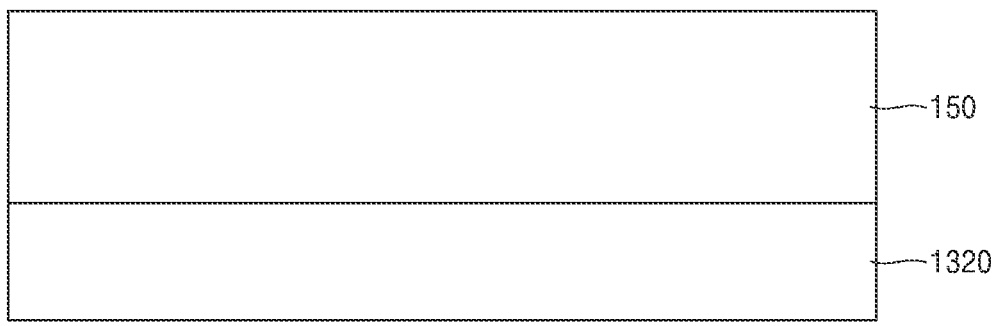
FIGS. 13, 14, 15, 16, 17, 18, 19, 20, 21, and 22 are cross-sectional views illustrating a method of manufacturing an image sensor including a nanorod pixel array according to an example embodiment.

First, as shown in FIG. 13, an interlayer insulating layer 150 is formed on a first substrate 1320. The first substrate 1320 may be or include an epitaxial substrate. For example, the first substrate 1320 may include a monocrystal silicon substrate.

Figure 14:
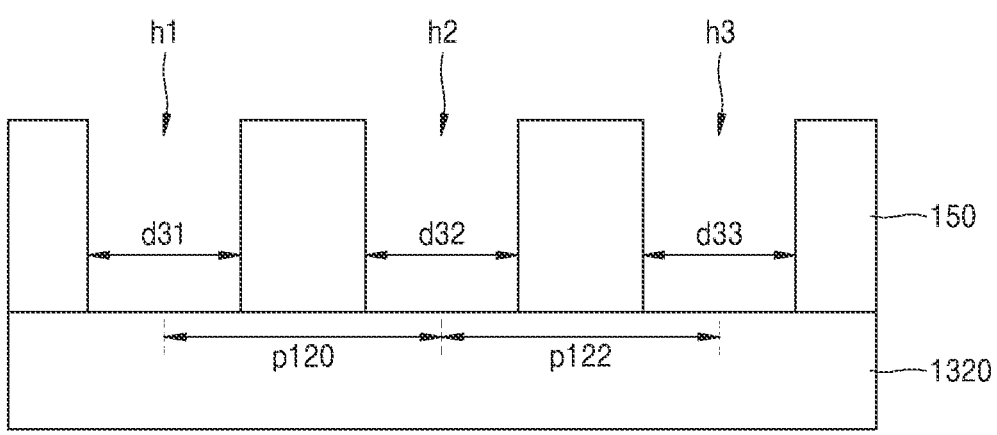

Next, as shown in FIG. 14, a first through-hole h1, a second through-hole h2, and a third through-hole h3 through which the first substrate 1320 is exposed are formed in the interlayer insulating layer 150. The first through-hole h1 is formed to have a first diameter d31. The second through-hole h2 is formed to have a second diameter d32. The third through-hole h3 is formed to have a third diameter d33. The first to third diameters d31, d32, and d33 may be different from each other. For example, the diameter may increase or decrease from the first diameter d31 to the third diameter d33.

However, embodiments are not limited thereto, and more than three through-holes may be formed in the interlayer insulating layer 150. The through-holes h1 to h3 formed in the interlayer insulating layer 150 define regions in which the nanorod-shaped pixels described with reference to FIGS. 1 to 12 are to be formed. The size of the nanorod-shaped pixel may be determined according to the size of the through-holes h1 to h3 formed in the interlayer insulating layer 150. Accordingly, dimensions (e.g., thickness or height, diameter, hole entrance area, etc.) of the through-holes h1 to h3 formed in the interlayer insulating layer 150 may be the same as or substantially the same as the dimensions of the pixels PX1 . . . PXm . . . PXn described with reference to FIG. 1. The first and second through-holes h1 and h2 are formed at a first pitch p120, and the second and third through-holes h2 and h3 are formed at a second pitch p122. The pitch of the through-holes h1 to h3 may correspond to a pitch of the pixels PX1 . . . PXm . . . PXn of FIG. 1. Accordingly, a pitch range between the through-holes h1 to h3 may be the same as or substantially the same as a pitch range of the pixels PX1 . . . PXm . . . PXn of FIG. 1.

Figure 15:
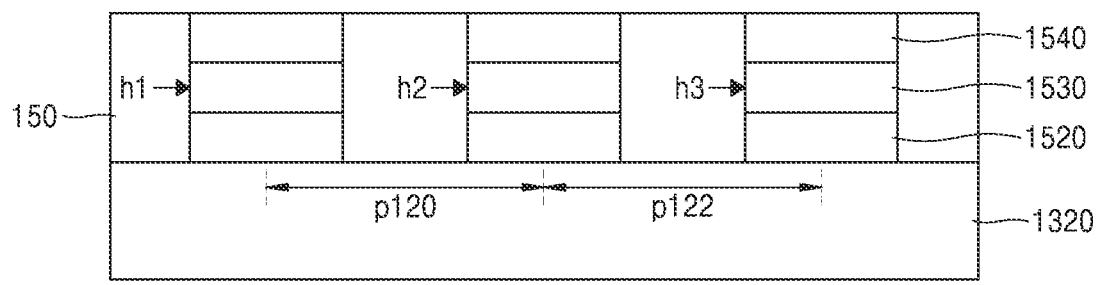

Next, as shown in FIG. 15, a first semiconductor layer 1520, a second semiconductor layer 1530, and a third semiconductor layer 1540 are sequentially formed on an upper surface of the first substrate 1320 exposed through the through-holes h1 to h3. In an example, each of the through-holes h1 to h3 may be filled with the sequentially grown first to third semiconductor layers 1520, 1530, and 1540. For example, the first to third semiconductor layers 1520, 1530, and 1540 may be formed by using an epitaxial method. The method of forming the first to third semiconductor layers 1520, 1530, and 1540 by using the epitaxial method may be performed at a relatively high temperature, for example, may be performed at 700° C. or higher.

In an example, the epitaxial method may include a chemical vapor deposition (CVD) method, for example, but may include a metal organic CVD (MOCVD) method, but is not limited thereto.

For example, the first semiconductor layer 1520 may be doped with a first dopant while growing the first semiconductor layer 1520 on the first substrate 1320 in the first to third through-holes h1 to h3. For example, during the growth of the first semiconductor layer 1520, the first dopant may be implanted into the first semiconductor layer 1520. The first dopant may be implanted to be evenly distributed throughout the first semiconductor layer 1520.

For example, the second semiconductor layer 1530 may be an intrinsic semiconductor layer. For example, after the first semiconductor layer 1520 is formed, the second semiconductor layer 1530 is continuously grown on the first semiconductor layer 1520. When the second semiconductor layer 1530 is grown, a dopant is not doped.

In an example, while the third semiconductor layer 1540 is grown on the second semiconductor layer 1530, the third semiconductor layer 1540 may be doped with a second dopant different from the first dopant. For example, during the growth of the third semiconductor layer 1540, the second dopant may be implanted into the third semiconductor layer 1540. The second dopant may be implanted to be evenly distributed throughout the third semiconductor layer 1540.

The first to third semiconductor layers 1520, 1530, and 1540 sequentially formed in each of the through holes h1 to h3 are photoelectric conversion elements and may be PIN-type or NIP-type pixels.

Accordingly, a process of sequentially stacking the first to third semiconductor layers 1520, 1530, and 1540 in each of the through holes h1 to h3 may be a process of forming a nanorod pixel array forming a meta surface.

Materials of the first to third semiconductor layers 1520, 1530, and 1540 may be the same as those of the first to third semiconductor layers 92, 94, and 96 described with reference to FIG. 9. The first and second dopants may also be the same as the first and second dopants described with reference to FIG. 9.

Figure 16:
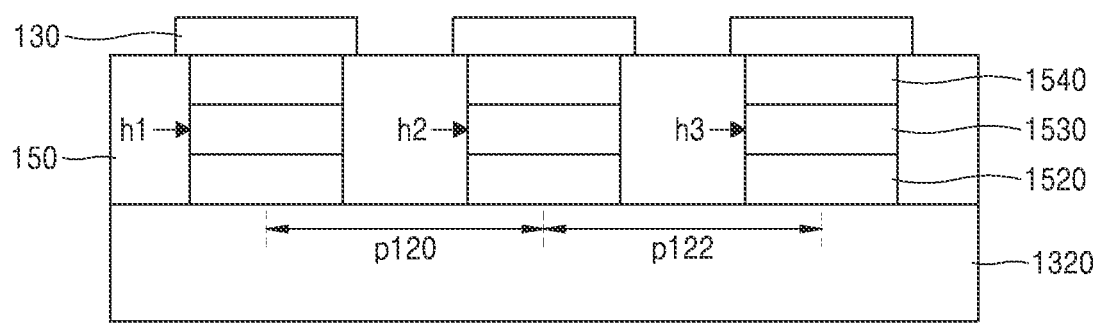

Next, as shown in FIG. 16, a first electrode layer 130 is formed on the interlayer insulating layer 150. The first electrode layer 130 may be provided on and cover the entire third semiconductor layer 1540, and may also be provided on and cover a portion of the interlayer insulating layer 150 around the first to third through-holes h1 to h3.

The first electrode layer 130 may be formed such that, after forming an electrode material layer covering the entire first to third through-holes h1 to h3 on the interlayer insulating layer 150, the electrode material layer is patterned so that only a portion corresponding to the first electrode layer 130 is left and the remaining portion is removed. The first electrode layer 130 may directly contact the third semiconductor layer 1540. The first electrode layer 130 may cover an entire upper surface of the third semiconductor layer 1540. The first electrode layer 130 may be parallel or substantially parallel to the first substrate 1320.

Figure 17:
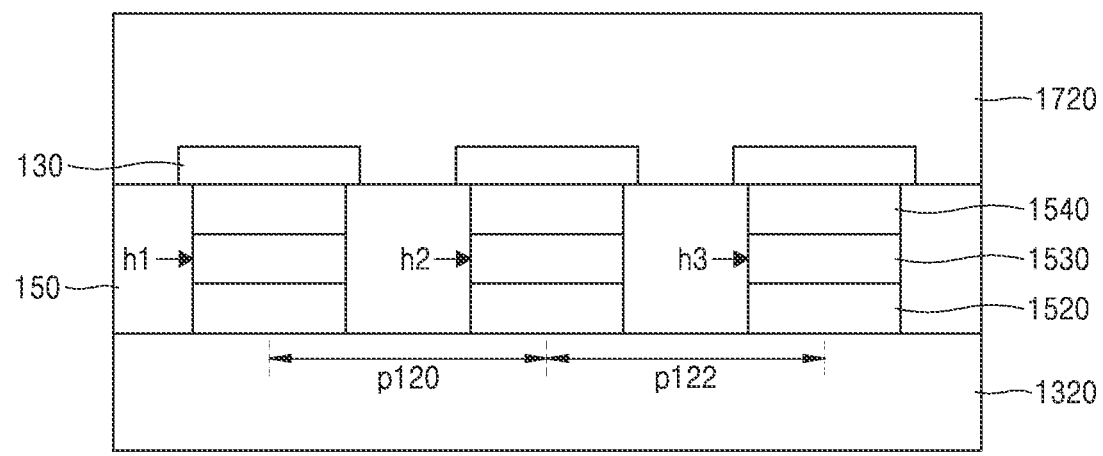

Next, as shown in FIG. 17, a second interlayer insulating layer 1720 provided on and covering the first electrode layer 130 is formed on the interlayer insulating layer 150. The second interlayer insulating layer 1720 may cover an entire upper surface and entire side surfaces of the first electrode layer 130. In an example, the second interlayer insulating layer 1720 may include the same insulating material as the interlayer insulating layer 150, but may include a different insulating material. For example, the second interlayer insulating layer 1720 may include a silicon oxide layer (e.g., a $SiO_2$ layer).

Figure 18:
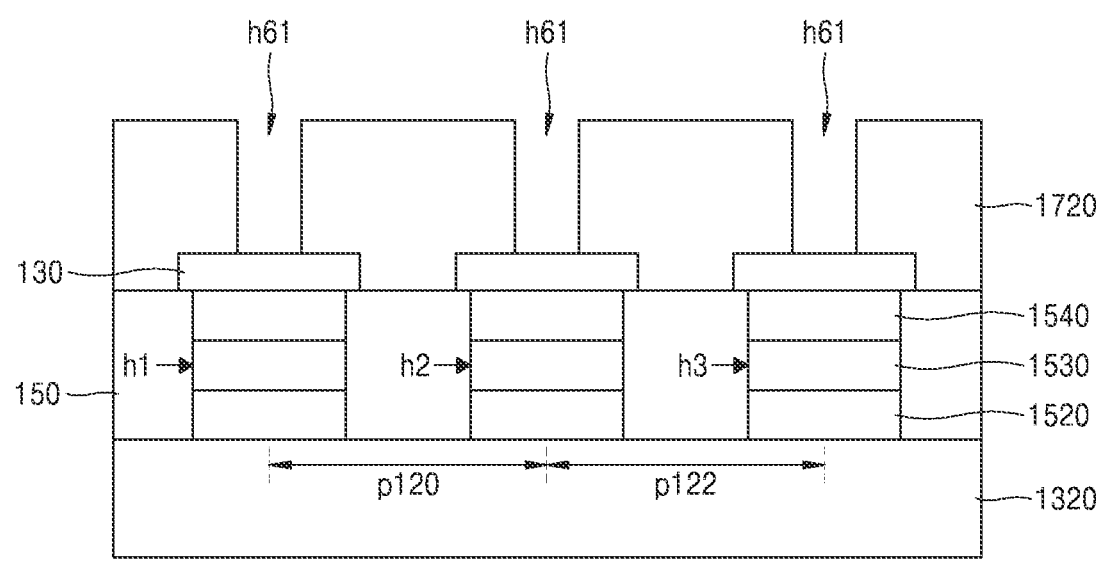

Next, as shown in FIG. 18, a plurality of fourth through-holes h61 are formed in the second interlayer insulating layer 1720. Each fourth through-hole h61 may be formed to be positioned on the first electrode layer 130. A portion of a surface, for example, a portion of an upper surface of the first electrode layer 130 may be exposed through each of the fourth through-holes h61.

The number of the plurality of fourth through-holes h61 may be formed to correspond to the number of the first electrode layers 130. For example, the number of the plurality of fourth through-holes h61 may be the same as the number of the first electrode layers 130, and accordingly, the plurality of fourth through-holes h61 may correspond one-to-one to the first electrode layer 130.

The plurality of fourth through-holes h61 are regions in which conductive wirings connected to the first electrode layer 130 are formed. Because the first electrode layer 130 is in direct contact with the third semiconductor layer 1540 of each pixel, the plurality of fourth through-holes h61 may be considered as regions where conductive wirings connected to each pixel of the pixel layer 140 are formed. In consideration of this point, each of the fourth through-holes h61 may be formed to have dimension for forming a wiring having a fine line width. For example, each of the fourth through-holes h61 may be formed in consideration of line widths of the conductive wirings 10M1 and 10M2 described with reference to FIG. 10.

Figure 19:
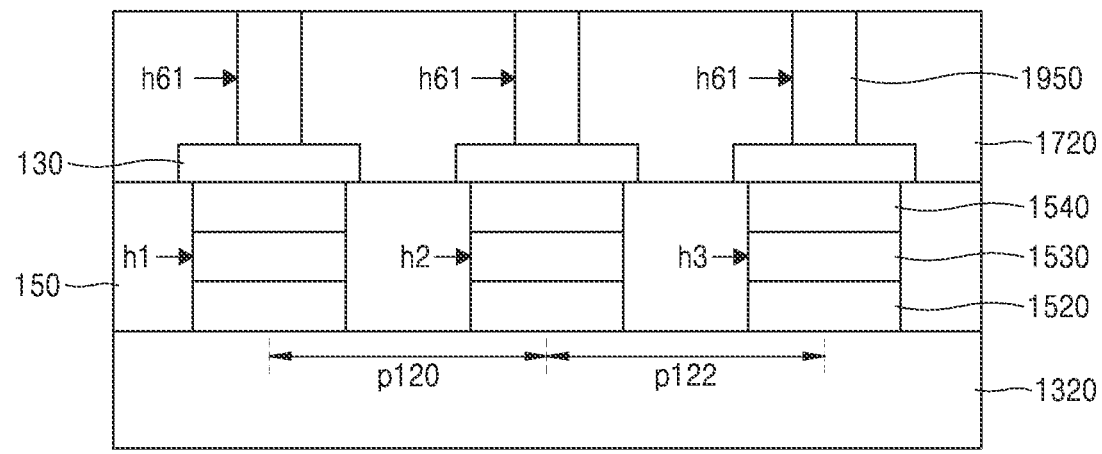

Next, as shown in FIG. 19, the plurality of fourth through-holes h61 may be filled with a conductive material layer 1950. The conductive material layer 1950 may be expressed as a conductive plug. The conductive material layer 1950 filling the fourth through-hole h61 may be formed by an atomic layer deposition (ALD) method or a CVD method, but is not limited thereto. In a process of forming the conductive material layer 1950 filling the fourth through-hole h61, the conductive material layer 1950 may also be formed on the second interlayer insulating layer 1720. In this case, a planarization process may be performed on the conductive material layer 1950. The planarization process may include a polishing process (e.g., a CMP process) or an etching process (e.g., an etch-back process) for an entire upper surface of the formed conductive material layer 1950. The planarization process may be performed until the second interlayer insulating layer 1720 is exposed. Due to the planarization process, an upper surface of the conductive material layer 1950 and a surface of the second interlayer insulating layer 1720 around the conductive material layer 1950 may form a single plane.

The process of forming the conductive material layer and filling the fourth through-hole h61 with the conductive material layer 1950 through a planarization process may be expressed as a metal damascene process.

The second interlayer insulating layer 1720 may be an insulating layer that fills between device(s) and wirings included in a circuit unit responsible for driving and controlling pixels, between devices, and between wirings. In addition, the conductive material layer 1950 may be not only conductive wirings connected to each pixel in a circuit unit but also wirings that connect elements included in the circuit unit. Accordingly, the layer including the second interlayer insulating layer 1720 and the conductive material layer 1950 may be a circuit unit or a circuit unit layer.

Figure 20:
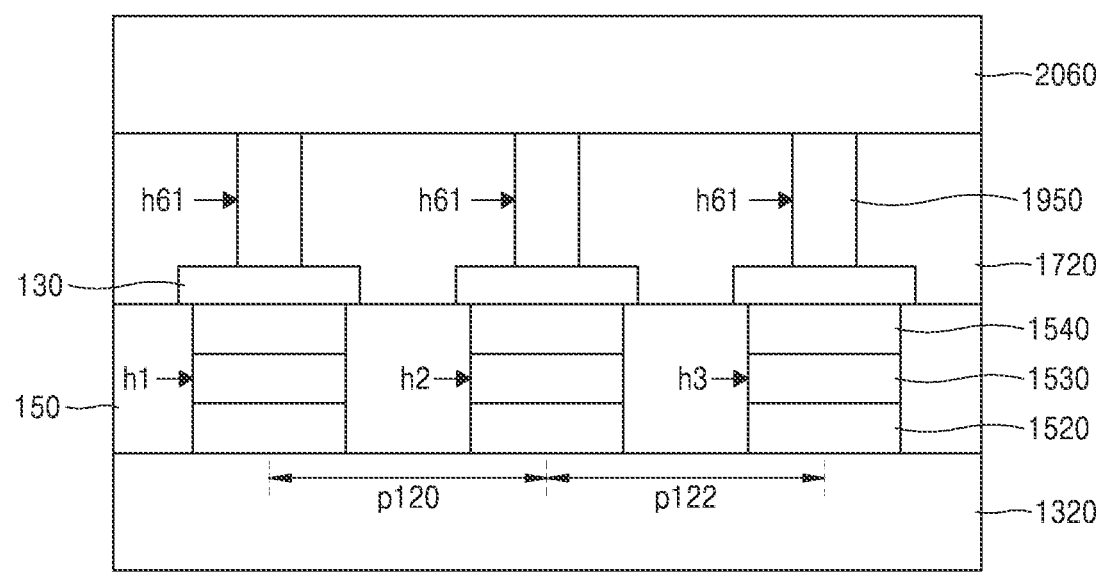

Next, as shown in FIG. 20, a second substrate 2060 is formed on the second interlayer insulating layer 1720. The second substrate 2060 may be formed to cover an entire upper surface of the second interlayer insulating layer 1720, the through-holes h61, and the conductive material layer 1950.

For example, the second substrate 2060 may be or include a silicon substrate. The second substrate 2060 may be a substrate supporting the image sensor. The second substrate 2060 may be a substrate supporting at least the pixel layer and the circuit unit.

A process of forming the second substrate 2060 may include a process of bonding the second substrate 2060 to a surface planarized by the planarization process described above, for example, the upper surface of the conductive material layer 1950 and the upper surface of the second interlayer insulating layer 1720 around the conductive material layer 1950. In an example, the second substrate 2060 may be bonded using an adhesive. For example, because the second substrate 2060 may be a silicon substrate and the second interlayer insulating layer 1720 may be a silicon oxide layer, the bonding of the second substrate 2060 may be performed by directly contacting a Si surface of the second substrate 2060 with a $SiO_2$ surface of the second interlayer insulating layer 1720 without using an adhesive.

After the second substrate 2060 is formed, the first substrate 1320 is separated and removed. For example, the method of removing the first substrate 1320 may include a method of polishing the first substrate 1320. The first substrate 1320 may be polished until at least the first semiconductor layer 1520 is exposed. In an example, polishing of the first substrate 1320 may be performed until entire bottom surfaces of the first semiconductor layer 1520 and the interlayer insulating layer 150 around the first semiconductor layer 1520 are exposed.

For example, the first substrate 1320 may be separated by using an interface separation method in which ultraviolet light is irradiated between the first substrate 1320 and the interlayer insulating layer 150 and the first semiconductor layer 1520. To this end, an interfacial separation layer that responds to ultraviolet light may be formed between the first substrate 1320 and the interlayer insulating layer 150 and the first semiconductor layer 1520 during a manufacturing process.

Figure 21:
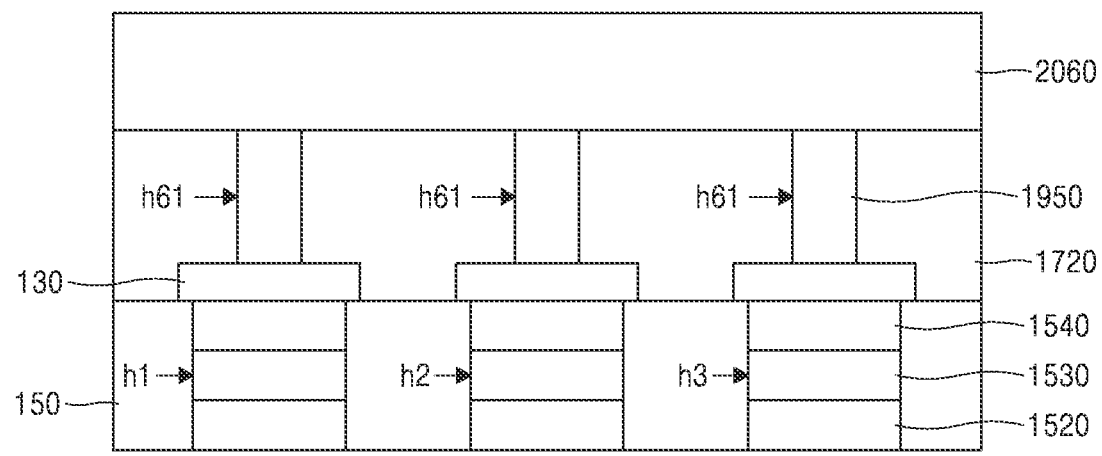

FIG. 21 shows a resultant product after the first substrate 1320 is separated in FIG. 20.

Figure 22:
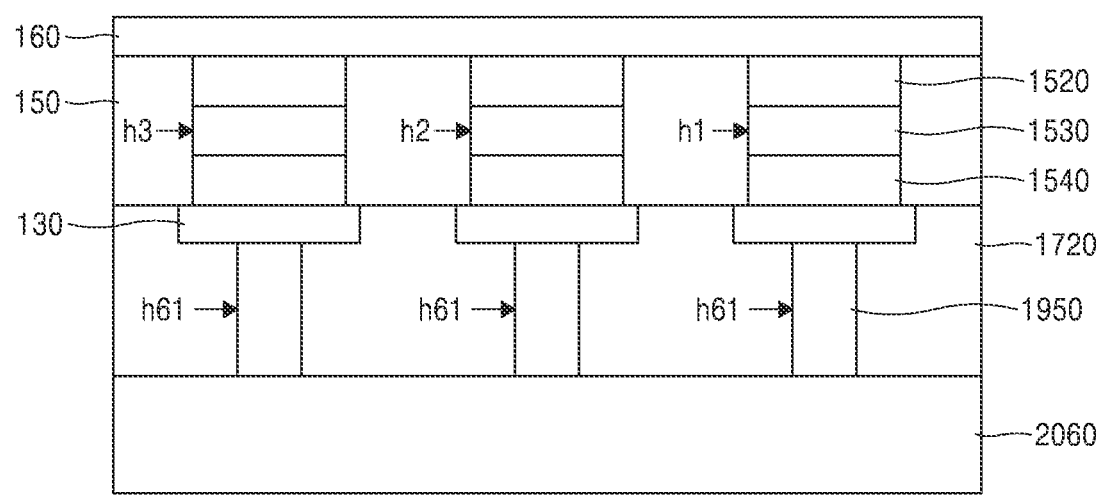

Next, as shown in FIG. 22, the resultant product of FIG. 21 is turned over so that the second substrate 2060 is positioned below and the first to third semiconductor layers 1520, 1530, and 1540 are positioned above the second substrate 2060.

After turning over the resultant product of FIG. 21, as shown in FIG. 22, a second electrode layer 160 covering the first semiconductor layer 1520 is formed on the interlayer insulating layer 150. The second electrode layer 160 may be in contact with an entire exposed surface of the first semiconductor layer 1520 exposed during the first substrate 1320 is removed.

Figure 23:
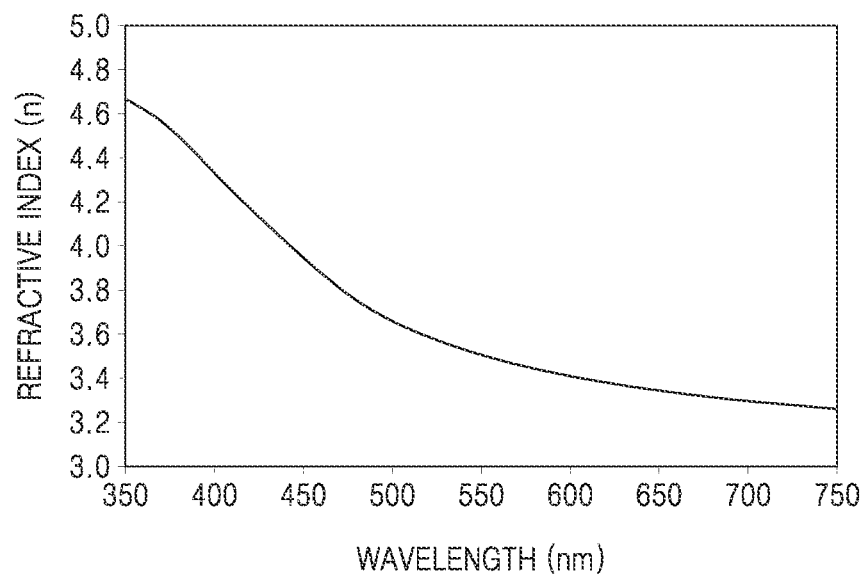
FIG. 23 is a graph showing a wavelength-refraction index relationship measured for GaP, which is an example of a material (compound semiconductor) of a nanorod pixel of an image sensor according to an example embodiment.

FIG. 23 is a graph showing a refractive index-wavelength relationship measured for GaP formed by MOCVD as an example of a material (Group III-V compound semiconductor) of a nanorod pixel of an image sensor according to an example embodiment. The horizontal axis represents wavelength, and the vertical axis represents refractive index.

Referring to FIG. 23, the refractive index n of GaP measured at a short wavelength (e.g., 450 nm) is about 3.95, and the refractive index n of GaP is 3.0 or more in an entire measurement wavelength band (in a range of about 350 nm to about 750 nm).

Figure 24:
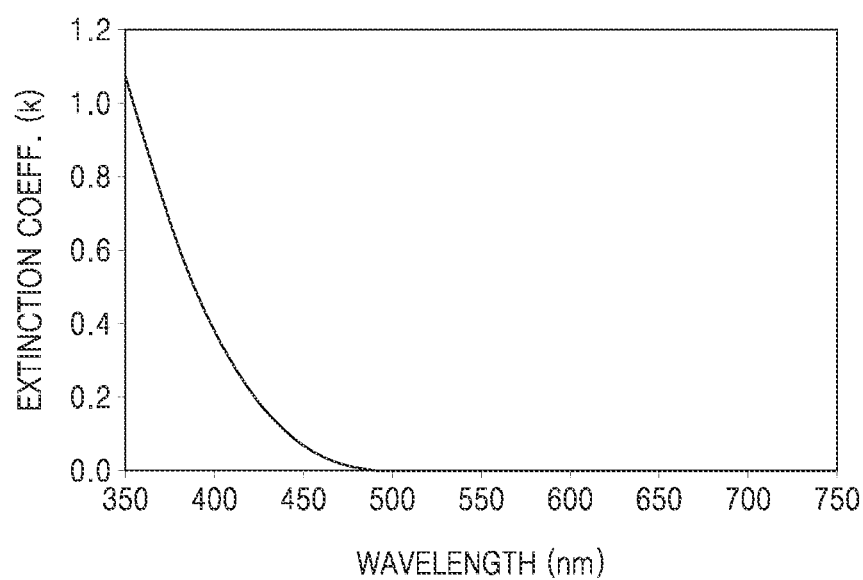
FIG. 24 is a graph showing a wavelength-extinction coefficient relationship measured for GaP, which is an example of a material (compound semiconductor) of a nanorod pixel of an image sensor according to an example embodiment.

FIG. 24 shows a wavelength-extinction coefficient relationship measured for GaP formed by MOCVD as an example of a material (e.g., Group III-V compound semiconductor) of a nanorod pixel of an image sensor according to an example embodiment. The horizontal axis represents wavelength, and the vertical axis represents extinction coefficient.

Referring to FIG. 24, the extinction coefficient k of GaP measured at a wavelength of 450 nm is about 0.06. This value is slightly greater than a theoretical value of an extinction coefficient of GaP, that is, 0.03, but is much less than an extinction coefficient of polysilicon of 0.141.

As a result, the results of FIGS. 23 and 24 suggest that GaP, which is a Group III-V compound semiconductor, has a low extinction coefficient while maintaining a high refractive index, and thus, may be one of materials capable of solving the light loss problem.

Figure 25:
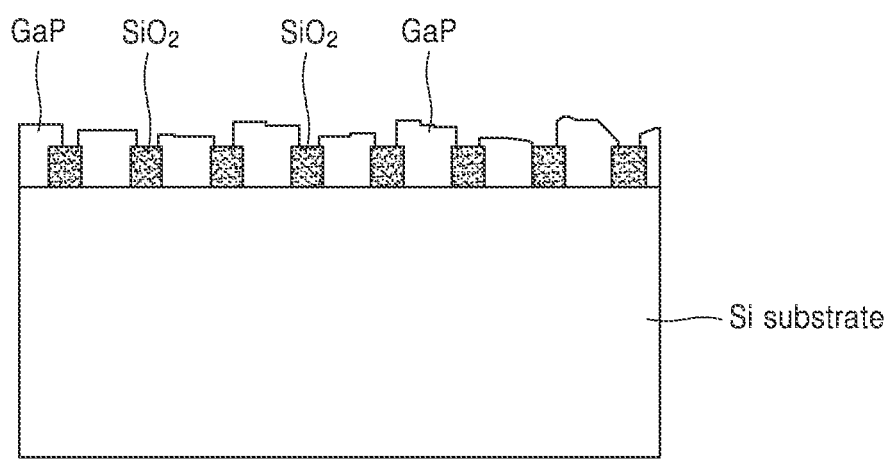
FIG. 25 is a cross-sectional view showing a nanorod-shaped GaP pixel array really formed by using a selective growth method in the manufacturing method of an image sensor illustrated in FIGS. 13 to 22.

FIG. 25 is a cross-sectional view showing a GaP pixel array in the form of a nanorod really formed by using a selective growth method in a method of manufacturing the image sensor illustrated in FIGS. 13 to 22. FIG. 25 may be a drawing drawn a scanning electron microscope (SEM) photograph showing a nanorod-shaped GaP pixel array formed by using a selective growth method in the manufacturing method of an image sensor illustrated in FIGS. 13 to 22.

FIG. 25 shows that nanorod GaP arrays may also be formed by the selective growth method in the illustrated method of manufacturing an image sensor.

Figure 26:
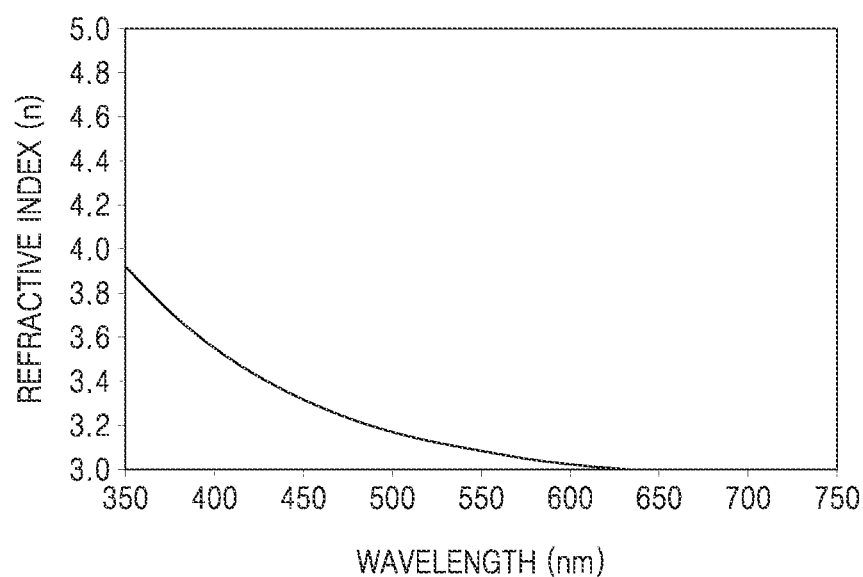
FIG. 26 is a graph illustrating a refractive index-wavelength relationship measured for AlGaP, which is an example of a Group III-V compound semiconductor used as a material for a nanorod pixel of an image sensor according to an example embodiment.

FIG. 26 is a graph showing a refractive index-wavelength relationship measured for AlGaP, which is an example of a Group III-V compound semiconductor used as a material for a nanorod pixel of an image sensor according to an example embodiment. The horizontal axis represents wavelength, and the vertical axis represents refractive index.

Referring to FIG. 26, the refractive index n of AlGaP measured at a wavelength of 450 nm belonging to a short wavelength region is about 3.32. This refractive index is significantly greater than the refractive index (~2.5) of $TiO_2$ that an extinction coefficient of 0.1 measured at a wavelength of 450 nm is less than 0.1 and that has the highest refractive index among low-absorption dielectrics.

Figure 27:
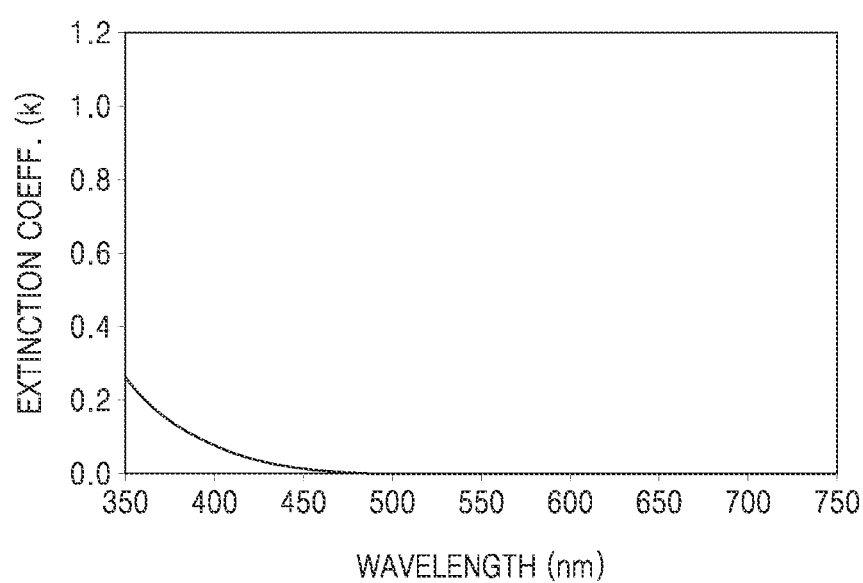
FIG. 27 is a graph showing a wavelength-extinction coefficient relationship measured for AlGaP, which is an example of a Group III-V compound semiconductor used as a material for a nanorod pixel of an image sensor according to an example embodiment.

FIG. 27 is a graph showing a wavelength-extinction coefficient relationship measured for AlGaP, which is an example of a Group III-V compound semiconductor used as a material for a nanorod pixel of an image sensor according to an example embodiment. The horizontal axis represents wavelength, and the vertical axis represents extinction coefficient.

Referring to FIG. 27, the extinction coefficient k of AlGaP measured at a short wavelength of 450 nm is as small as 0.01.

Combining the measurement results of FIGS. 26 and 27, AlGaP, which is an example of a Group III-V compound semiconductor, has a low extinction coefficient in a short wavelength band while maintaining a high refractive index like GaP, and accordingly, AlGaP may be one of materials that may solve the problem of light loss.

On the other hand, in the case of InGaN, which is an example of a Group III-V compound semiconductor doped with In, when an element content ratio of Ga to In is greater than 1 (Ga/In>1), a band gap becomes 2.3 eV or more.

Therefore, InGaN may also be used as a material having a high refractive index and an extinction coefficient k less than 0.03.

Figure 28:
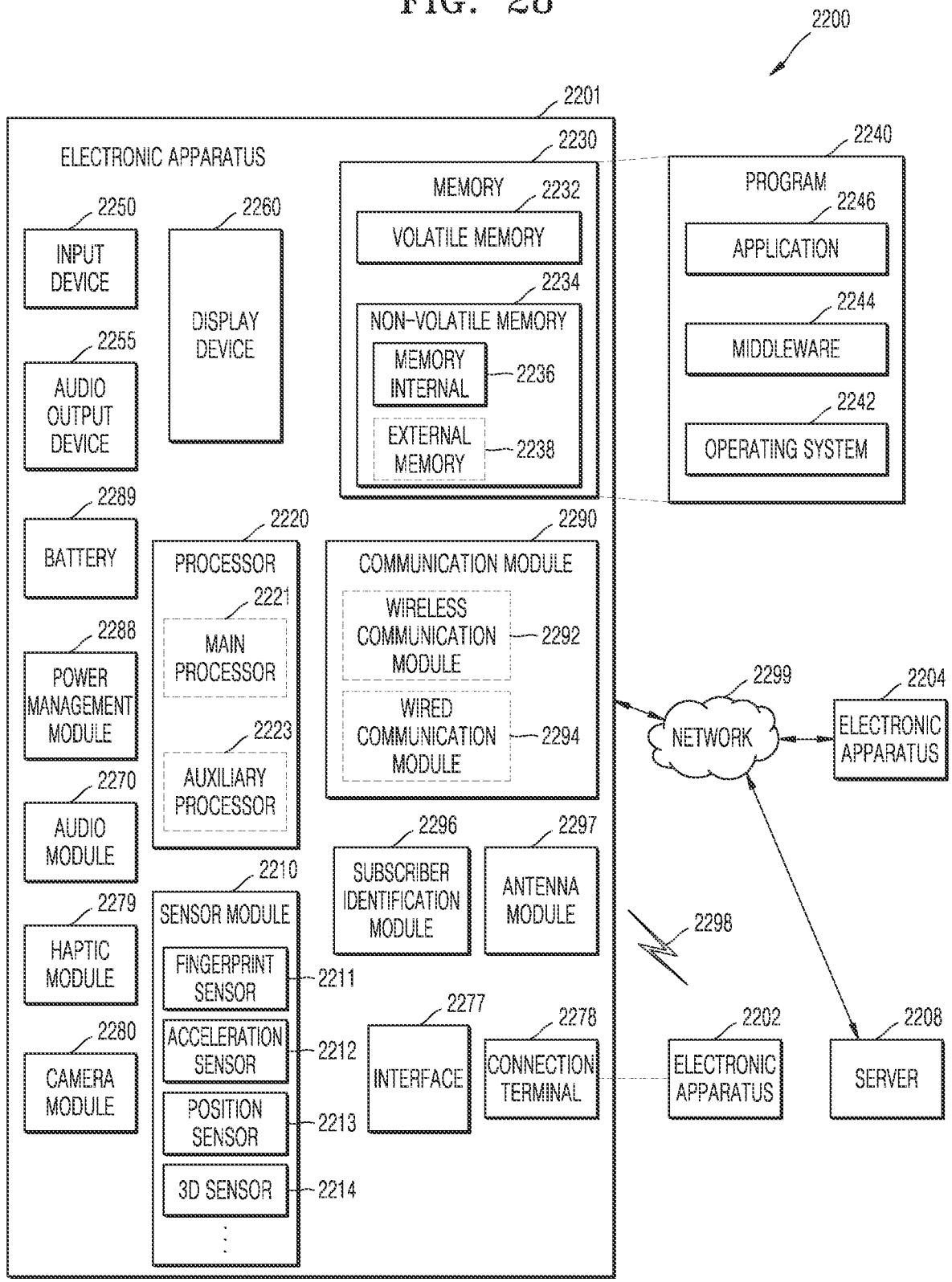
FIG. 28 is a block diagram illustrating an electronic device according to an example embodiment.

The image sensor having the nanorod pixel array according to an example embodiment described above may be applied to various electronic devices, and FIG. 28 shows an example thereof.

Referring to FIG. 28, in a network environment 2200, an electronic device 2201 includes various devices and modules as shown.

A camera module 2280, which is one of the modules, may capture still images and moving images. For example, the camera module 2280 may include an imaging system including one of the various image sensors described above with reference to FIGS. 1 to 12. For example, the camera module 2280 may include a window assembly, image sensors, image signal processors, and/or flashes. The window assembly included in the camera module 2280 may collect light emitted from an object, which is an image capturing object. A power management module 2288 may manage power supplied to the electronic device 2201. The power management module 2288 may be implemented as part of a Power Management Integrated Circuit (PMIC).

A battery 2289 may supply power to components of the electronic device 2201. The battery 2289 may include a non-rechargeable primary cell, a rechargeable secondary cell, and/or a fuel cell.

A communication module 2290 may establish a direct (wired) communication channel and/or wireless communication channel between the electronic device 2201 and other electronic devices (electronic device 2102, electronic device 2104, server 2208, etc.) and perform communication through an established communication channel. The communication module 2290 may include one or more communication processors that operate independently of a processor 2220 (such as an application processor) and support direct communication and/or wireless communication. The communication module 2290 may include a wireless communication module 2292 (a cellular communication module, a short-range wireless communication module, a Global Navigation Satellite System (GNSS) communication module, etc.) and/or a wired communication module 2294 (Local Area Network (LAN) communication) module, power line communication module, etc.). Among these communication modules, a corresponding communication module may communicate with other electronic apparatuses through the first network 2298 (a short-range communication network, such as Bluetooth, WiFi Direct, or Infrared Data Association (IrDA)) or the second network 2299 (a telecommunication network, such as a cellular network, the Internet, or a computer network (LAN) and WAN, etc.). The various types of communication modules may be integrated into one component (a single chip, etc.) or implemented as a plurality of components (plural chips) separate from each other. The wireless communication module 2292 may identify and authenticate the electronic device 2201 within a communication network, such as the first network 2298 and/or the second network 2299 by using subscriber information (such as, International Mobile Subscriber Identifier (IMSI)) stored in a subscriber identification module 2296.

The antenna module 2297 may transmit or receive signals and/or power to and from the outside (other electronic devices, etc.). An antenna may include a radiator having a conductive pattern formed on a substrate (PCB, etc.). The antenna module 2297 may include one or a plurality of antennas. When a plurality of antennas is included in the antenna module 2297, an antenna suitable for a communication method used in a communication network, such as the first network 2298 and/or the second network 2299 from among the plurality of antennas may be selected by the communication module 2290. Signals and/or power may be transmitted or received between the communication module 2290 and another electronic device through the selected antenna. In addition to the antenna, other components (an RFIC, etc.) may be included as part of the antenna module 2297.

Some of the components, between peripheral devices, may be connected to each other through communication methods (bus, General Purpose Input and Output (GPIO), Serial Peripheral Interface (SPI), Mobile Industry Processor Interface (MIPI), etc.) and signals (commands, data, etc.) may be interchangeable. Commands or data may be transmitted or received between the electronic device 2201 and the external electronic device 2204 through the server 2208 connected to the second network 2299. The other electronic devices 2202 and 2204 may be the same type as or different types from the electronic device 2201. All or part of the operations executed in the electronic device 2201 may be executed in one or more of the other electronic devices 2202 and 2204 and server 2208. For example, when the electronic device 8201 needs to perform a function or service, the electronic device 8201 may request one or more other electronic devices to perform part or all function or service instead of executing the function or service itself. One or more other electronic devices receiving the request may execute an additional function or service related to the request and transmit a result of the execution to the electronic device 2201. To this end, cloud computing, distributed computing, and/or client-server computing technologies may be used.

Figure 29:
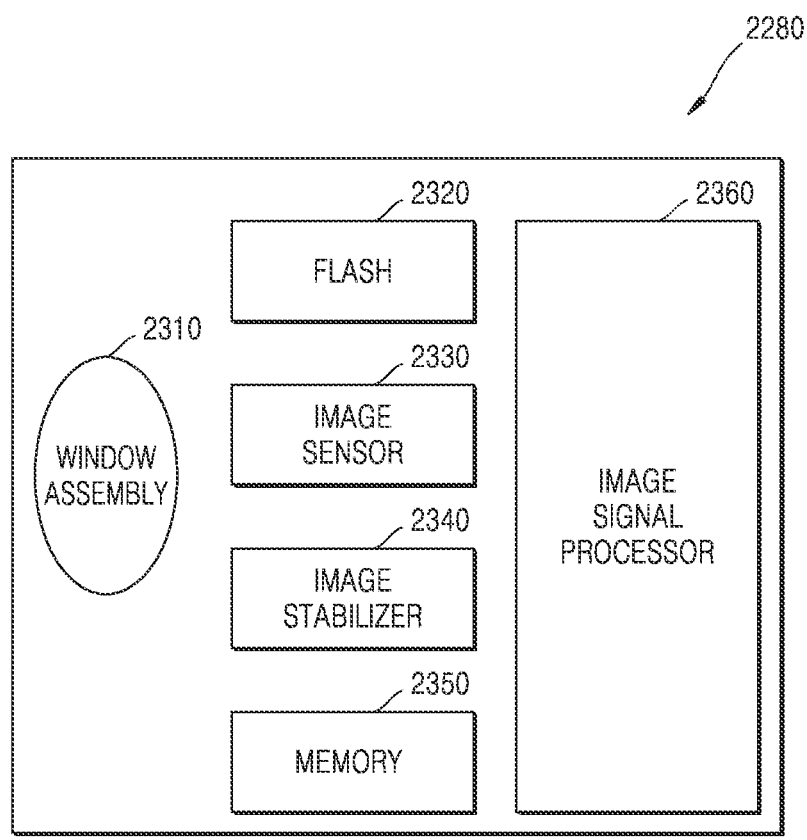
FIG. 29 is a block diagram showing a schematic configuration of a camera module included in the electronic device of FIG. 28.

FIG. 29 is a block diagram showing a schematic configuration of a camera module included in the electronic device of FIG. 28.

Referring to FIG. 29, the camera module 2280 may include a window assembly 2310, a flash 2320, an image sensor 2330, an image stabilizer 2340, a memory 2350 (buffer memory, etc.), and/or an image signal. processor 2360 may be included. The window assembly 2310 may collect light emitted from an object to be imaged, and may include a window layer, at least one coded mask layer, a filter layer, and an anti-reflection film.

The camera module 2280 may include a plurality of window assemblies 2310, and in this case, the camera module 2280 may be a dual camera, a 360° camera, or a spherical camera. Some of the plurality of window assemblies 2310 may have the same optical characteristic (angle of view, focal length, auto focus, F number, optical zoom, etc.) or may have different optical characteristics. The window assembly 2310 may include optical characteristics corresponding to a wide-angle lens or a telephoto lens.

The flash 2320 may emit light used to enhance light emitted or reflected from the object. The flash 2320 may include one or more light emitting diodes (Red-Green-Blue (RGB) LED, White LED, Infrared LED, Ultraviolet LED, etc.), and/or a Xenon Lamp. The image sensor 2330 may acquire an image corresponding to the object by converting light emitted or reflected from the object and transmitted through the window assembly 2310 into an electrical signal. The image sensor 2330 may include a PIN-type or NIP-type image sensor including a nanorod-shaped compound semiconductor pixel, or a PIN-type or NIP-type image sensor including together a nanorod-shaped compound semiconductor pixel and a nanorod-shaped non-compound semiconductor pixel, for example, include one of the various image sensors described above with reference to FIGS. 1 to 12.

The image stabilizer 2340 may compensate for a negative effect of movement by moving the window assembly 2310 or the image sensor 2330 in a specific direction or controlling operation characteristics (adjustment of read-out timing, etc.) of the image sensor 2330 in response to the movement of the camera module 2280 or the electronic device 2301 including the same. The image stabilizer 2340 may detect the movement of the camera module 2280 or the electronic device 2201 using a gyro sensor (not shown) or an acceleration sensor (not shown) disposed inside or outside the camera module 2280. The image stabilizer 2340 may be optically implemented.

The memory 2350 may store some or all data of an image acquired through the image sensor 2330 for a subsequent image processing operation. For example, when a plurality of images is acquired at a high speed, after storing acquired original data (Bayer-Patterned data, high-resolution data, etc.) in the memory 2350 and only a low-resolution image is displayed, the original data of the selected (user selection, etc.) image may be used to be transmitted to the image signal processor 2360. The memory 2350 may be integrated into the memory 2230 of the electronic device 2201 or may be configured as a separate memory operated independently. The memory 2350 may also include a restoration algorithm for an image restoration operation to be performed by the image signal processor 2360.

The image signal processor 2360 may perform one or more image processing on an image acquired through the image sensor 2330 or image data stored in the memory 2350. The one or more image processing may include generating a depth map, three-dimensional modeling, generating a panorama, extracting feature points, synthesizing an image, image restoration, and/or image compensation (noise reduction, resolution adjustment, brightness adjustment, blurring, sharpening, softening, etc.). The image signal processor 2360 may perform control (exposure time control, readout timing control, etc.) on components (such as, the image sensor 2330) included in the camera module 2280. An image processed by the image signal processor 2360 may be stored back in the memory 2350 for further processing or provided to an external component (the memory 2230, the display device 2260, the electronic device 2202, the electronic device 2204, the server 2208, etc.). The image signal processor 2360 may be integrated into the processor 2220 or configured as a separate processor operated independently of the processor 2220. When the image signal processor 2360 is configured as a separate processor from the processor 2220, an image processed by the image signal processor 2360 may be subjected to an additional image processing by the processor 2220 and then displayed on the display device 2260.

The electronic device 2201 may include a plurality of camera modules 2280 each having different properties or functions. In this case, one of the plurality of camera modules 2280 may be a wide-angle camera, and another may be a telephoto camera. Similarly, one of the plurality of camera modules 2280 may be a front camera and another may be a rear camera.

The image sensor according to an embodiment includes a pixel array in the form of a nanorod that may form a meta surface. At least some pixels among the plurality of pixels included in the pixel array have a high refractive index greater than 2 and an extinction coefficient k in a short wavelength region (e.g., 450 nm) of a visible light band is less than 0.05.

Therefore, when the disclosed image sensor is used, it is possible to substantially prevent light loss in a short wavelength region of a visible light band, which is pointed out as a problem when only silicon Si nanorod pixels having a size less than 1 μm are used, and also, even when optical loss occurs, light loss may be minimized. Accordingly, when the disclosed image sensor is used, photoelectric conversion efficiency may be increased in the entire visible light band, and a high-resolution image may be obtained.

While many details are set forth in the foregoing description, they should be construed as illustrative of exemplary embodiments, rather than to limit the scope of the disclosure. Therefore, the scope of the present disclosure should not be defined by the described embodiments but should be determined by the technical spirit described in the claims.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:
    a plurality of first electrode layers spaced apart from each other;
    a second electrode layer opposite to the plurality of first electrode layers; and
    a pixel layer provided between the plurality of first electrode layers and the second electrode layer, the pixel layer comprising a plurality of nanorod pixels,
    wherein a size of each nanorod pixel among the plurality of nanorod pixels is less than 1 μm,
    wherein the plurality of nanorod pixels comprises a first pixel comprising a compound semiconductor, and
    wherein the first pixel comprises:
        a first compound semiconductor layer doped with a first dopant;
        a second compound semiconductor layer that is undoped; and
        a third compound semiconductor layer doped with a second dopant different from the first dopant, and
    wherein each of the plurality of first electrode layers individually contact each of the plurality of nanorod pixels.

2. The image sensor of claim 1, wherein the plurality of nanorod pixels further comprises a second pixel comprising a compound semiconductor,
    wherein a size of the first pixel is different from a size of the second pixel, and
    wherein the second pixel comprises:
        a first compound semiconductor layer doped with the first dopant;
        a second compound semiconductor layer that is undoped; and
        a third compound semiconductor layer doped with the second dopant different from the first dopant.

3. The image sensor of claim 2, wherein the plurality of nanorod pixels further comprises a third pixel comprising a compound semiconductor,
    wherein a size of the third pixel is different from the size of the first pixel and the size of the second pixel, and
    wherein the third pixel comprises:
        a first compound semiconductor layer doped with the first dopant;
        a second compound semiconductor layer that is undoped; and
        a third compound semiconductor layer doped with the second dopant different from the first dopant.

4. The image sensor of claim 1, wherein the plurality of nanorod pixels further comprises a fourth pixel comprising a non-compound semiconductor, and
    wherein the fourth pixel comprises:
        a first non-compound semiconductor layer doped with the first dopant;
        a second non-compound semiconductor layer that is undoped; and
        a third non-compound semiconductor layer doped with the second dopant different from the first dopant.

5. The image sensor of claim 1, wherein the first compound semiconductor layer, the second compound semiconductor layer, and the third compound semiconductor layer comprise a Group III-V compound semiconductor layer, a refractive index n of the Group III-V compound semiconductor layer being greater than 2.4 and an extinction coefficient k of the Group III-V compound semiconductor layer being less than 0.05.

6. The image sensor of claim 5, wherein the Group III-V compound semiconductor layer comprises one of gallium phosphide (GaP), aluminum gallium phosphide (AlGaP), gallium nitride (GaN), and indium gallium nitride (InGaN).

7. The image sensor of claim 1, wherein one of the first dopant and the second dopant comprises a p-type dopant, and the other of the first dopant and the second dopant comprises an n-type dopant.

8. The image sensor of claim 7, wherein the p-type dopant comprises one of magnesium (Mg) and zinc (Zn).

9. The image sensor of claim 7, wherein the n-type dopant comprises one of silicon (Si), germanium (Ge), sulfur (S), selenium (Se), and tellurium (Te).

10. The image sensor of claim 4, wherein one of the first dopant and the second dopant comprises a p-type dopant, and the other of the first dopant and the second dopant comprises an n-type dopant.

11. The image sensor of claim 10, wherein the p-type dopant comprises one of magnesium (Mg) and zinc (Zn).

12. The image sensor of claim 10, wherein the n-type dopant comprises one of silicon (Si), germanium (Ge), sulfur (S), selenium (Se), and tellurium (Te).

13. The image sensor of claim 4, wherein the first non-compound semiconductor layer, the second non-compound semiconductor layer, and the third non-compound semiconductor layer comprise silicon.

14. The image sensor of claim 1, wherein a thickness of each nanorod pixel among the plurality of nanorod pixels is less than or equal to 500 nm.

15. The image sensor of claim 1, wherein a diameter of each nanorod pixel among the plurality of nanorod pixels is in a range of 50 nm to 500 nm.

16. The image sensor of claim 1, wherein the plurality of nanorod pixels is provided with a pitch in a range of 100 nm to 800 nm.

17. The image sensor of claim 1, wherein the plurality of nanorod pixels form an array,
wherein the array comprises a unit array comprising a plurality of pixels, and
wherein the plurality of pixels included in the unit array are provided in a quadrangle shape, a square shape, or a hexagonal shape.

18. The image sensor of claim 1, wherein each nanorod pixel among the plurality of nanorod pixels has a circular column shape or a polygonal column shape.

19. The image sensor of claim 1, further comprising a circuit unit configured to drive and control the pixel layer,
wherein the circuit unit comprises a plurality of conductive wirings respectively connected to the plurality of first electrode layers.

20. The image sensor of claim 19, wherein a line width of each conductive wiring among the plurality of conductive wirings is in a range of 20 nm to 150 nm.

21. The image sensor of claim 19, wherein each conductive wiring comprises one of ruthenium (Ru), cobalt (Co), molybdenum (Mo), titanium nitride (TiN), tantalum nitride (TaN), copper (Cu), tungsten (W), and aluminum (Al).

22. A method of manufacturing an image sensor, the method comprising:
forming a plurality of vertical nanorod pixels on a first substrate;
forming a first electrode layer on each of the plurality of vertical nanorod pixels;
forming a conductive wiring on the first electrode layer;
forming a second substrate on the conductive wiring;
removing the first substrate; and
forming a second conductive layer on a surface of a pixel exposed by removing the first substrate,
wherein a size of each vertical nanorod pixel among the plurality of vertical nanorod pixels is less than 1 μm, and
wherein the plurality of vertical nanorod pixels comprises a plurality of pixels comprising compound semiconductors.

23. The method of claim 22, wherein the plurality of vertical nanorod pixels further comprises a plurality of pixels comprising non-compound semiconductors.

24. The method of claim 22, wherein the plurality of pixels comprising the compound semiconductors comprise pixels having different sizes,
wherein each pixel among the plurality of pixels comprises:
a compound semiconductor layer doped with a first dopant;
an undoped compound semiconductor layer; and
a compound semiconductor layer doped with a second dopant different from the first dopant.

25. The method of claim 23, wherein the plurality of pixels of comprising the non-compound semiconductors comprises pixels having different sizes,
wherein each pixel among the plurality of pixels comprising the non-compound semiconductors comprises:
a non-compound semiconductor layer doped with a first dopant;
an undoped non-compound semiconductor layer; and
a non-compound semiconductor layer doped with a second dopant different from the first dopant.

26. The method of claim 22, wherein the plurality of nanorod pixels form an array,
wherein the array comprises a unit array comprising a plurality of pixels, and
wherein the plurality of pixels included in the unit array are provided in a quadrangle shape, a square shape, or a hexagonal shape.

27. The method of claim 22, wherein each nanorod pixel among the plurality of vertical nanorod pixels has a circular column shape or a polygonal column shape.

28. The method of claim 22, wherein the forming of the plurality vertical of nanorod pixels on the first substrate comprises:
forming an interlayer insulating layer on the first substrate;
forming a through hole through which the first substrate is exposed in the interlayer insulating layer; and
forming a compound semiconductor layer on the first substrate in the through hole.

29. The method of claim 22, wherein the compound semiconductors comprise a Group III-V compound semiconductor having a refractive index n greater than 2.4 (n>2.4) and an extinction coefficient k less than 0.05 (k<0.05).

30. An electronic device comprising:
an image sensor comprising:
a plurality of first electrode layers spaced apart from each other;
a second electrode layer opposite to the plurality of first electrode layers; and
a pixel layer provided between the plurality of first electrode layers and the second electrode layer, the pixel layer comprising a plurality of nanorod pixels,
wherein a size of each nanorod pixel among the plurality of nanorod pixels is less than 1 μm,
wherein the plurality of nanorod pixels comprises a first pixel comprising a compound semiconductor,
wherein each of the plurality of first electrode layers individually contact each of the plurality of nanorod pixels, and
wherein the first pixel comprises:
a first compound semiconductor layer doped with a first dopant;
a second compound semiconductor layer that is undoped; and
a third compound semiconductor layer doped with a second dopant different from the first dopant.

* * * * *